(12) United States Patent
Kihara et al.

(10) Patent No.: US 7,634,493 B2
(45) Date of Patent: *Dec. 15, 2009

(54) EDITING APPARATUS AND EDITING METHOD

(75) Inventors: Nobuyuki Kihara, Tokyo (JP); Teppei Yokota, Chiba (JP)

(73) Assignee: Sony Corporation, Tokyo (JP)

( * ) Notice: Subject to any disclaimer, the term of this patent is extended or adjusted under 35 U.S.C. 154(b) by 1084 days.

This patent is subject to a terminal disclaimer.

(21) Appl. No.: 11/079,576

(22) Filed: Mar. 14, 2005

(65) Prior Publication Data

US 2005/0175318 A1    Aug. 11, 2005

Related U.S. Application Data

(63) Continuation of application No. 09/535,003, filed on Mar. 24, 2000, now Pat. No. 7,089,271.

(30) Foreign Application Priority Data

| Mar. 25, 1999 | (JP) | 11-081535 |
| Jun. 29, 1999 | (JP) | 11-183412 |
| Dec. 8, 1999 | (JP) | 11-349108 |

(51) Int. Cl.
*G06F 17/00* (2006.01)

(52) U.S. Cl. .................. 707/102; 707/100; 707/101

(58) Field of Classification Search .......... 707/100–102
See application file for complete search history.

(56) References Cited

U.S. PATENT DOCUMENTS

| 5,805,544 A | 9/1998 | Haneda |
| 5,845,210 A | 12/1998 | Moon |
| 5,845,240 A | 12/1998 | Fielder |
| 6,085,323 A * | 7/2000 | Shimizu et al. ............. 713/150 |
| 6,278,678 B1 * | 8/2001 | Iida ............................ 369/83 |
| 6,404,676 B2 * | 6/2002 | Kihara et al. .......... 365/185.12 |

\* cited by examiner

*Primary Examiner*—Sana Al-Hashemi
(74) *Attorney, Agent, or Firm*—Frommer Lawrence & Haug LLP; William S. Frommer; Thomas F. Presson

(57) ABSTRACT

An editing apparatus and method for dividing or combining a data file(s) that is segmented into blocks of a predetermined data length and recorded in a non-volatile memory. An attribute file having a predetermined length is modified so as to reflect such dividing or combining. Such attribute file is recorded in the non-volatile memory.

1 Claim, 37 Drawing Sheets

FILE SYSTEM PROCESS
HIERARCHY

Fig. 11

REPRODUCTION MANAGEMENT FILE (PBLIST)

|  | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0X0000 | BLKID-TL0 | | | | Reserved | | MCode | | REVISION | | | | Reserved | | | |
| 0X0010 | SN1C+L | | SN2C+L | | SINFSIZE | | T-TRK | VerNo | | | | | Reserved | | | |
| 0X0020 | NM1-S(256) | | | | | | | | | | | | | | | |
| 0X0120 | NM2-S(512) | | | | | | | | | | | | | | | |
| 0X0320 | | | | Reserved | | | | | | | CONTENTSKEY | | | | | |
| 0X0330 | | | | Reserved | | | | | | | MAC | | | | | |
| | | | | | | | Reserved | | | | | | | S-YMDhms | | |
| 0X0350 | TRK-001 | TRK-002 | | TRK-003 | | TRK-004 | | TRK-005 | | TRK-006 | | TRK-007 | | TRK-008 | | |
| | TRK-009 | TRK-010 | | TRK-011 | | TRK-012 | | TRK-013 | | TRK-014 | | TRK-015 | | TRK-016 | | |
| 0X0660 | TRK-393 | TRK-394 | | TRK-395 | | TRK-396 | | TRK-397 | | TRK-398 | | TRK-399 | | TRK-400 | | |
| 0X0670 | INF-S(14720) | | | | | | | | | | | | | | | |
| 0X3FF0 | BLKID-TL0 | | | | Reserved | | MCode | | REVISION | | | | Reserved | | | |

TRKTBL: 0X0350 – 0X0660

Fig. 12A

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0X0000 | BLKID-TL0 | | | | Reserved | | MCode | | REVISION | | | | Reserved | | | |
| 0X0010 | SN1C+L | SN2C+L | | | SINFSIZE | | T-TRK | | VerNo | | Reserved | | | | | |
| 0X0020 | NM1-S(256) | | | | | | | | | | | | | | | |
| 0X0120 | NM2-S(512) | | | | | | | | | | | | | | | |
| 0X0320 | Reserved | | | | | | | | | | | | | | | |
| 0X0330 | Reserved | | | | | | | | | | | | | | | |

Fig. 12B

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0X0350 | TRK-001 | | TRK-002 | | TRK-003 | | TRK-004 | | TRK-005 | | TRK-006 | | TRK-007 | | TRK-008 | |
| 0X0360 | TRK-009 | | TRK-010 | | TRK-011 | | TRK-012 | | TRK-013 | | TRK-014 | | TRK-015 | | TRK-016 | |
| ... | | | | | | | | | | | | | | | | |
| 0X0660 | TRK-393 | | TRK-394 | | TRK-395 | | TRK-396 | | TRK-397 | | TRK-398 | | TRK-399 | | TRK-400 | |
| 0X0670 | INF-S(14720) | | | | | | | | | | | | | | | |
| 0X3FF0 | BLKID-TL0 | | | | Reserved | | MCode | | REVISION | | | | Reserved | | | |

{ TRKTBL: 0X0350 – 0X0660 }

Also within 12A: CONTENTSKEY, MAC, S-YMDhms, Reserved fields.

Fig. 12C

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| | INF | 0x00 | ID | 0x00 | SIZE | | MCode | | C+L | | Reserved | | DATA VARIABLE LENGTH | | | |

Fig. 13

| ID | MUSIC INFORMATION (CHARACTERS) | | ID | URL INFORMATION (WEB) | |
|---|---|---|---|---|---|
| 0 | RESERVED | | 32 | RESERVED | |
| 1 | ALBUM | VARIABLE | 33 | ALBUM | VARIABLE |
| 2 | SUBTITLE | VARIABLE | 34 | SUB TITLE | VARIABLE |
| 3 | ARTIST | VARIABLE | 35 | ARTIST | VARIABLE |
| 4 | CONDUCTOR | VARIABLE | 36 | CONDUCTOR | VARIABLE |
| 5 | ORCHESTRA | VARIABLE | 37 | ORCHESTRA | VARIABLE |
| 6 | PRODUCER | VARIABLE | 38 | PRODUCER | VARIABLE |
| 7 | PUBLISHER | VARIABLE | 39 | PUBLISHER | VARIABLE |
| 8 | COMPOSER | VARIABLE | 40 | COMPOSER | VARIABLE |
| 9 | SONG WRITER | VARIABLE | 41 | SONG WRITER | VARIABLE |
| 10 | ARRANGER | VARIABLE | 42 | ARRANGER | VARIABLE |
| 11 | SPONSOR | VARIABLE | 43 | SPONSOR | VARIABLE |
| 12 | CM | VARIABLE | 44 | CM | VARIABLE |
| 13 | GUIDE | VARIABLE | 45 | GUIDE | VARIABLE |
| 14 | ORIGINAL MUSIC PROGRAM TITLE | VARIABLE | 46 | ORIGINAL MUSIC PROGRAM NAME | VARIABLE |
| 15 | ORIGINAL ALBUM TITLE | VARIABLE | 47 | ORIGINAL MUSIC PROGRAM ALBUM NAME | VARIABLE |
| 16 | ORIGINAL MUSIC PROGRAM COMPOSER | VARIABLE | 48 | ORIGINAL MUSIC PROGRAM COMPOSER | VARIABLE |
| 17 | ORIGINAL MUSIC PROGRAM SONG WRITER | VARIABLE | 49 | ORIGINAL MUSIC PROGRAM SONG WRITER | VARIABLE |
| 18 | ORIGINAL MUSIC PROGRAM ARRANGER | VARIABLE | 50 | ORIGINAL MUSIC PROGRAM ARRANGER | VARIABLE |
| 19 | ORIGINAL MUSIC PROGRAM PERFORMER | VARIABLE | 51 | ORIGINAL MUSIC PROGRAM PERFORMER | VARIABLE |
| 20 | MESSAGE | VARIABLE | 52 | | |
| 21 | COMMENT | VARIABLE | 53 | | |
| 22 | WARNING | VARIABLE | 54 | | |
| 23 | GENRE | VARIABLE | 55 | | |
| 24 | | | 56 | | |
| 25 | | | 57 | | |
| 26 | | | 58 | | |
| 27 | | | 59 | | |
| 28 | | | 60 | | |
| 29 | | | 61 | | |
| 30 | | | 62 | | |
| 31 | | | 63 | | |

Fig. 14

| ID | PATH/OTHERS | | ID | CONTROL/NUMERIC DATA INFORMATION | |
|---|---|---|---|---|---|
| 64 | RESERVED | | 96 | RESERVED | |
| 65 | PATH TO VIDEO DATA | VARIABLE | 97 | ISRC | 8 |
| 66 | PATH TO SONG DATA | VARIABLE | 98 | TOC_ID | 8 |
| 67 | PATH TO MIDI DATA | VARIABLE | 99 | UPC/JAN | 7 |
| 68 | PATH TO GUIDE DATA | VARIABLE | 100 | RECORDED DATE (YMDhms) | 4 |
| 69 | PATH TO COMMENT DATA | VARIABLE | 101 | RELEASED DATE | 4 |
| 70 | PATH TO CM DATA | VARIABLE | 102 | ORIGINAL MUSIC PROGRAM RELEASED DATE (YMDhms) | 4 |
| 71 | PATH TO FAX DATA | VARIABLE | 103 | RECORDED DATE (YMDhms) | 4 |
| 72 | PATH TO COMMUNICATION DATA 1 | VARIABLE | 104 | SUB TRACK | 4 |
| 73 | PATH TO COMMUNICATION DATA 2 | VARIABLE | 105 | AVERAGE VOLUME LEVEL | 1 |
| 74 | PATH TO CONTROL DATA | VARIABLE | 106 | RESUME | 4 |
| 75 | | | 107 | REPRODUCTION LOG (YMDhms) | 4 |
| 76 | | | 108 | NUMBER OF REPRODUCTION TIMES (FOR LEARNING) | 1 |
| 77 | | | 109 | PASSWORD 1 | 16 |
| 78 | | | 110 | APPLevel | 16 |
| 79 | | | 111 | GENRE CODE | 1 |
| 80 | | | 112 | MIDI DATA | |
| 81 | | | 113 | THUMB NAIL PHOTOGRAPH DATA | |
| 82 | | | 114 | TEXT MULTIPLEXED BROADCAST DATA | |
| 83 | | | 115 | NUMBER OF TOTAL MUSIC PROGRAMS | |
| 84 | | | 116 | SET NUMBER | |
| 85 | | | 117 | NUMBER OF TOTAL SETS | |
| 86 | | | 118 | REC POSITION INFORMATION - GPS | VARIABLE |
| 87 | | | 119 | PB POSITION INFORMATION - GPS | VARIABLE |
| 88 | | | 120 | REC POSITION INFORMATION - PHS | VARIABLE |
| 89 | | | 121 | PB POSITION INFORMATION - PHS | VARIABLE |
| 90 | | | 122 | CONNECTION DESTINATION TELEPHONE NUMBER 1 | VARIABLE |
| 91 | | | 123 | CONNECTION DESTINATION TELEPHONE NUMBER 2 | VARIABLE |
| 92 | | | 124 | INPUT VALUE | VARIABLE |
| 93 | | | 125 | OUTPUT VALUE | VARIABLE |
| 94 | | | 126 | PB CONTROL DATA | VARIABLE |
| 95 | | | 127 | REC CONTROL DATA | VARIABLE |

Fig. 15

| ID | SYNCHRONOUS REPRODUCTION INFORMATION | |
|---|---|---|
| 128 | RESERVED | |
| 129 | SYNCHRONOUS REPRODUCTION INFORMATION 1 | VARIABLE |
| 130 | SYNCHRONOUS REPRODUCTION INFORMATION 2 | VARIABLE |
| 131 | SYNCHRONOUS REPRODUCTION INFORMATION 3 | VARIABLE |
| 132 | SYNCHRONOUS REPRODUCTION INFORMATION 4 | VARIABLE |
| 133 | SYNCHRONOUS REPRODUCTION INFORMATION 5 | VARIABLE |
| 134 | SYNCHRONOUS REPRODUCTION INFORMATION 6 | VARIABLE |
| 135 | | |
| 136 | | |
| 137 | | |
| 138 | EMD INFORMATION 1 | VARIABLE |
| 139 | EMD INFORMATION 2 | VARIABLE |
| 140 | | |
| 141 | | |
| 142 | | |
| 143 | | |
| 144 | | |
| 145 | | |
| 146 | | |
| 147 | | |
| 148 | | |
| 149 | | |
| 150 | | |
| 151 | | |
| 152 | | |
| 153 | | |
| 154 | | |
| 155 | | |
| 156 | | |
| 157 | | |
| 158 | | |
| 159 | | |

Fig. 17

A3Dnnnnn.MSA(ATRAC3 DATA FILE)

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0x0000 | BLKID-HD0 | | | | Reserved | | MCode | | Reseved | | | | BLOCK SERIAL | | | |
| 0x0010 | N1C+L | | N2C+L | | INFSIZE | | T-PRT | | T-SU | | | | INX | | XT | |
| 0x0020 | NM1(256) | | | | | | | | | | | | | | | |
| 0x0120 | NM2(512) | | | | | | | | | | | | | | | |
| 0x0310 | | | | | | | | | | | | | | | | |
| 0x0320 | | Reserved(8) | | | | | | | CONTENTSKEY | | | | | | | |
| | | Reserved(8) | | | | | | | MAC | | | | | | | |
| | | Reserved(12) | | | | | | | | | | A | LT | | FNo | |
| | MG(D)SERIAL-nnn | | | | | | | | | | | | | | | |
| 0x0360 | CONNUM | | | | YMDhms-S | | | | YMDhms-E | | | | MT | CT | CC | CN |
| 0x0370 | PRTSIZE | | | | PRTKEY | | | | | | | | Reserved(8) | | | |
| 0x0380 | | | | | CONNUM0 | | | | PRTSIZE(0x0388) | | | | PRTKEY | | | |
| 0x0390 | | | | | Reserved(8) | | | | | | | | CONNUM0 | | | |
| | INF(0x0400) | | | | | | | | | | | | | | | |
| 0x3FFF | BLKID-HD0 | | | | Reserved | | MCode | | Reseved | | | | BLOCK SERIAL | | | |
| 0x4000 | BLKID-A3D | | | | Reserved | | MCode | | CONNUM0 | | | | BLOCK SERIAL | | | |
| 0x4010 | BLOCK SEED | | | | | | | | INITILIZATION VECTOR | | | | | | | |
| 0x4020 | SU-000(Nbyte=384byte) | | | | | | | | | | | | | | | |
| 0x41A0 | SU-001(Nbyte) | | | | | | | | | | | | | | | |
| 0x4320 | SU-002(Nbyte) | | | | | | | | | | | | | | | |
| 0x04A0 | SU-041(Nbyte) | | | | | | | | | | | | | | | |
| 0x7DA0 | | | | | | | | | | | | | | | | |
| 0x7F20 | Reserved(Nbyte=208byte) | | | | | | | | | | | | | | | |
| | BLOCK SEED | | | | | | | | | | | | | | | |
| 0x7FF0 | BLKID-A3D | | | | Reserved | | MCode | | CONNUM0 | | | | BLOCK SERIAL | | | |

Fig. 18

|        | 0 | 1 | 2 | 3 | 4 | 5 | 6 | 7 | 8 | 9 | A | B | C | D | E | F |
|--------|---|---|---|---|---|---|---|---|---|---|---|---|---|---|---|---|
| 0x0000 | BLKID-HD0 | | | | Reserved | | MCode | | Reseved | | | | BLOCK SERIAL | | | |
| 0x0010 | N1C+L | | N2C+L | | INFSIZE | | T-PRT | | T-SU | | | | INX | | XT | |
| 0x0020 | NM1(256) | | | | | | | | | | | | | | | |
| 0x0120 | NM2(512) | | | | | | | | | | | | | | | |
| 0x0310 | | | | | | | | | | | | | | | | |

Fig. 19

| | | | | | | | |
|---|---|---|---|---|---|---|---|
| 0x0320 | Reserved(8) | | CONTENTSKEY | | | | |
| | Reserved(8) | | MAC | | | | |
| | Reserved(12) | | | | A | LT | FNo |
| | MG(D)SERIAL-nnn | | | | | | |
| 0x0360 | CONNUM | YMDhms-S | YMDhms-E | | MT | CT | CC | CN |

Fig. 20 bit7:MODE OF ATRAC3    0:Dual    1:Joint bit6,5,4    N OF 3 BITS:MODE VALUE

| N | MODE | TIME | TRANSMISSION RATE | SU | BYTES |
|---|------|------|-------------------|----|-------|
| 7 | HQ   | 47min | 176kbps | 31SU | 512 |
| 6 |      | 58min | 146kbps | 38SU | 424 |
| 5 | EX   | 64min | 132kbps | 42SU | 384 |
| 4 | SP   | 81min | 105kbps | 53SU | 304 |
| 3 |      | 90min | 94kbps  | 59SU | 272 |
| 2 | LP   | 128min | 66kbps | 84SU | 192 |
| 1 | mono | 181min | 47kbps | 119SU | 136 |
| 0 | mono | 258min | 33kbps | 169SU | 96 | bit3:Reserved bit2:DATA TYPE    0:AUDIO    1:OTHER bit1:REPRODUCTION SKIP    0:NORMAL REP    1:SKIP bit0:EMPHASIS    0:OFF    1:ON(50/15 $\mu$ S)

Fig. 21

```
bit7      :COPY PERMISSION    0:COPY PROHIBITION    1:COPY PERMISSION
bit6      :GENERATION    0:ORIGINAL    1:FIRST OR LATER COPY GENERATION
HCMS bit5-4 :COPY CONTROL FOR HIGH SPEED DIGITAL COPY
           00:COPY PROHIBITION  01:COPY FIRST GENERATION 10:COPY PERMISSION
           COPY OF FIRST COPY GENERATION IS PROHIBITED.
bit3-2    MagicGate AUTHENTICATION LEVEL
           00:Level0(Non-MG)      01:Level1
           10:Level2              11:Reserved
           DIVIDE AND COMBINE ARE PROHIBITED IN OTHER THAN LEVEL 10.
bit1,0    Reserved
```

Fig. 22

| 0x0370 | PRTSIZE | PRTKEY | | Reserved(8) |
|---|---|---|---|---|
| 0x0380 | | CONNUM0 | PRTSIZE(0x0388) | PRTKEY |
| 0x0390 | Reserved(8) | | | CONNUM0 |

Fig. 23

| 0x4000 | BLKID-A3D | Reserved | MCode | CONNUM0 | BLOCK SERIAL |
|---|---|---|---|---|---|
| 0x4010 | BLOCK SEED | | | INITILIZATION VECTOR | |
| 0x4020 | SU-000(Nbyte=384byte) | | | | |

Fig. 27

TRACK INFORMATION MANAGEMENT FILE
(TRKLIST.MSF)

| offset | 0 1 2 3 | 4 5 | 6 7 | 8 9 A B | C D E F |
|---|---|---|---|---|---|
| 0x0000 | BLK ID-TL0 | T-TRK | MCode | REVISION | YMD h ms |
| 0x0010 | N1 N2 MSID | S-TRK | PASS | APP | INF-S | S_YMD h ms |
| 0x0020 | TRKINF-001 ||||
| | PRTINF-001 ||||
| | TRKINF-002 ||||
| | PRTINF-002 ||||
| | ⟨ ||||
| 0x3FF0 | BLK ID-TL0 | | MCode | REVISION | |
| 0x4000 | BLK ID-TL1 | | MCode | REVISION | |

⟨

DETAIL OF TRKINF-nnn/PRTINF-nnn

| 0 1 | 2 3 | 4 5 6 7 | 8 9 A B C D E F |
|---|---|---|---|
| T0 LT | INF -nnn | FNM-nnn | CONTENTS KEY-nnn |
| | | MG(D) SERIAL-nnn ||
| APP_CTL | CONNUM-nnn | P-nnn | XT | INX-nnn |
| YMDhms-S | YMDhms-E | MT CT CC CN | Reserved |
| PR | A-0000 | PRTSIZE-0000 | PRTKEY-0000 |
| | ⟨ | | |
| PR | A-nnnn | PRTSIZE-nnnn | PRTKEY-nnnn |

| 0x7FF0 | BLK ID-TL1 | | MCode | REVISION | |

Fig. 28

STICK NAME, PROGRAM NAME BLOCK – 1-BYTE AREA

|  | 0 | 1 | 2 | 3 | 4 | 5 | 6 | 7 |
|---|---|---|---|---|---|---|---|---|
| 0x8000 | BLK ID-NM1 | | | | | | MCode | |
| 0x8008 | PNM1-S | | | | PNM1-001 | | | |
| 0x8010 | PNM1-002 | | | | PNM1-003 | | | |
| | ⌇ | | | | | | | |
| 0x8668 | PNM1-408 | | | | NM1-S | | | |
| | NM1-001 NM1-002 NM1-003 ⌇ NM1-408 | | | | | | | |
| 0xBFF0 | | | | | | | | |
| 0xBFF8 | BLK ID-NM1 | | | | | | MCode | |

Fig. 29

STICK NAME, PROGRAM NAME BLOCK – 2-BYTE AREA

|  | 0 | 1 | 2 | 3 | 4 | 5 | 6 | 7 |
|---|---|---|---|---|---|---|---|---|
| 0xC000 | BLK ID-NM2 | | | | | | MCode | |
| 0xC008 | PNM2-S | | | | PNM2-001 | | | |
| 0xC010 | PNM2-002 | | | | PNM2-003 | | | |
| | ⌇ | | | | | | | |
| 0xC668 | PNM2-408 | | | | NM2-S | | | |
| | NM2-001 NM2-002 NM2-003 ⌇ NM2-408 | | | | | | | |
| 0xFFF0 | | | | | | | | |
| 0xFFF8 | BLK ID-NM2 | | | | | | MCode | |

Fig. 30

ATRAC3 DATA FILE (A3Dnnnnn.MSA) ··· 1 SoundUnit.N BYTES

| Offset | 0 | 1 | 2 | 3 | 4 | 5 | 6 | 7 |
|---|---|---|---|---|---|---|---|---|
| 0x0000 | BLK ID-A3D | | | | | | MCode | |
| 0x0008 | BLOCK SEED | | | | | | | |
| 0x0010 | CONNUM0 | | | | BLOCK SERIAL | | | |
| 0x0018 | INITILIZATION VECTOR | | | | | | | |
| 0x0020 | SU-000 (N byte) | | | | | | | |
| 0x0020 +N/8 | SU-001 (N byte) | | | | | | | |
| | SU-002 (N byte) | | | | | | | |
| | SU-(nnn-1) (N byte) | | | | | | | |
| 0x3FF0 -N/8 | Reserved (M byte) | | | | | | | |
| 0x3FF0 | BLOCK SEED | | | | | | | |
| 0x3FF8 | BLK ID-A3D | | | | | | MCode | |

Fig. 31

ADDITIONAL INFORMATION MANAGEMENT FILE (INFLIST MSF)

|  | 0 1 2 3 | 4 5 | 6 7 | 8 9 A B | C D E F |
|---|---|---|---|---|---|
| 0x0000 | BLK ID-INF | T-DAT | MCode | YMDhms | INF-409 |
| 0x0010 | INF-001 | INF-002 | | INF-003 | INF-004 |
| 0x0020 | INF-005 | INF-006 | | INF-007 | INF-008 |
| | ∫ | ∫ | | ∫ | ∫ |
| 0x0660 | INF-405 | INF-406 | | INF-407 | INF-408 |
| 0x07F0 | Reserved ||||
| 0x0800 | DataSlot-00C0 ||||
| 0x0810 | DataSlot-00C1 ||||
| | ∫ ||||
| 0x3FF0 | DataSlot-03 7F(895dec) ||||
| 0x4000 | DataSlot-03 8 0 ||||
| | ∫ ||||
| | DataSlot-FFFF(MAXIMUM VALUE) ||||

Fig. 32

ADDITIONAL INFORMATION DATA STRUCTURE

| 0 1 | 2 | 3 | 4 5 | 6 7 | 8 9 A B C D E F |
|---|---|---|---|---|---|
| IN ID | SID | 00 | SIZE | MCode | |
| VARIABLE LENGTH DATA ||||||

EDITING APPARATUS AND EDITING METHOD

This is a continuation of application Ser. No. 09/535,003 filed Mar. 24, 2000, now U.S. Pat. No. 7,089,271, the entirety of which is incorporated herein by reference.

BACKGROUND OF THE INVENTION

The present invention relates to an editing apparatus and method for performing an editing process such as a divide process, or a combine process, for a file(s) recorded in a memory card using a File Allocation Table ("FAT").

Electrically Erasable Programmable Read-Only Memory ("EEPROM") is electrically rewritable memory that requires a relatively large physical space because each bit of memory storage is composed of two transistors. Thus, the integration of EEPROM is restricted. To address this problem, flash memory capable of storing one bit with one transistor using an all-bit-erase system was developed. Flash memory may become a successor of recording media such as magnetic disks and optical discs. Flash memory may be used in memory cards that can be freely attached to an apparatus and detached therefrom. A digital audio recorder/player may use such a memory card instead of a Compact Disc™ ("CD") or Mini Disc™ ("MD").

One file management system used for a personal computer is called the File Allocation Table ("FAT") system. In the FAT system, when a particular file is defined, predetermined parameters are successively set to the file. Thus, the size of a file becomes variable. One file is composed of at least one management unit (sector, cluster, or the like). Data corresponding to the management unit is written to a table referred to as the FAT. In the FAT file system, a file structure can be easily formed regardless of the physical characteristics of a recording medium. Thus, the FAT file system may be used for a magneto-optical disc, a floppy disk, or a hard disk. In addition, the FAT file system may be used for the above-mentioned memory card.

However, a CD from which audio data is reproduced does not employ the FAT system concept at all. In an MD, with which audio data can be recorded and reproduced, music programs are recorded and edited using an FAT modified system called Link-P. Thus, although low power CPUs, may be used to control such systems, data therefrom cannot be exchanged with a personal computer. As a result, the MD system has been developed as an isolated Audio-Video (A/V) system.

The Link-P system used for MDs includes a Pointer for Defective Area ("P-DFA"), a Pointer for Empty slot area ("P-Empty"), a Pointer for Freely Area ("P-FRA"), and P-TNO1 . . . P-TNo255. The P-DFA represents the top position of a slot that contains information of a defect on an MD. The P-Empty area represents the use state of a slot. The P-FRA represents the top position of a slot used for managing a recordable area. The P-TNo1, P-TNo2, . . . , P-TNo255 represent the start positions of slots corresponding to individual music programs.

Next, with reference to FIGS. 42A to 42E, a process for successively searching recordable areas dispersed on a recording medium will be described using the area P-FRA. The volume of the P-FRA is 03h. In this case, slot 03h (as shown in FIG. 42A) is accessed. The start address and the end address recorded in slot 03h represent the start address and the end address of one part on a disc.

As shown in FIG. 42A, link information recorded in slot 03h represents that the next slot address is 18h. Thus, slot 18h (shown in FIG. 42B) is accessed. Link information recorded in slot 18h represents that the next slot address is 1Fh. Likewise, slot 1Fh (shown in FIG. 42C) is accessed. As shown in FIG. 42D, corresponding to link information in slot 1Fh, slot 2Bh is accessed. As shown in FIG. 42E, corresponding to link information in slot 2Bh, slot E3h is accessed. In such a manner, link information is traced until a null (00h) is detected as link information. Thus, the addresses of recordable areas dispersed on an MD are successively recognized. Alternatively, by controlling an optical pickup and successively accessing these addresses, recordable areas dispersed on the MD can be obtained. Likewise, by referencing the P-DFA or the P-TNoN, defective areas that are dispersed on the MD can be successfully accessed.

With the Link-P system used for MDs, an editing process, such as a divide process and a combine process, for a music program(s) can be easily performed. Although music programs on an optical disc can be edited, files in a nonvolatile memory cannot. As with the editing process using the Link-P system, a divide process or a combine process for a music program(s) can be performed by editing the FAT. However, if the FAT is destroyed, the editing process cannot be performed, and an edited file cannot be accessed. In particular, flash memory deteriorates each time it is rewritten. To address this problem, data is recorded in flash memory in such a manner that it is not repeatedly recorded to the same block. However, under this method, repeatedly editing stored data may still cause defective blocks. Furthermore, if a block that is used to manage the FAT information is destroyed, the editing process cannot be performed and the edited file cannot be accessed.

OBJECTS OF THE INVENTION

An object of the present invention is to provide an editing apparatus and method for a nonvolatile memory for adding an attribute file to the beginning of each data file and using the attribute files to manage parts of data files that are dispersed in the memory so that files in the memory can be edited even if the FAT area is destroyed.

Other objects and advantages of the invention will in part be obvious and will in part be apparent from the specification and the drawings.

SUMMARY OF THE INVENTION

A first embodiment of the present invention is an editing apparatus for editing a data file recorded in a nonvolatile memory for segmenting a single data file that is successively reproduced to blocks each having a predetermined data length, the nonvolatile memory having a data area for recording each block along with an attribute file having a predetermined length and a management area for recording management data for managing a data file recorded in the data area, the editing apparatus comprising an operating device for selecting two data files recorded in the data area so as to perform a combine process for the selected two data files, a separating device for separating an attribute file from a backward side data file of the selected two data files, an editing device for editing the management data recorded in the management area so that the two data files are logically linked and an attribute file added to a forward side data file of the selected two data files, and a recording device for recording the management data edited by the editing device to the management area and the attribute file added to the forward side data file to the data area.

A second embodiment of the present invention is an editing apparatus for editing a data file recorded in a nonvolatile memory for segmenting a single data file that is successively reproduced to blocks each having a predetermined data length, the nonvolatile memory having a data area for recording each block along with an attribute file having a predetermined length and a management area for recording management data for managing a data file recorded in the data area, the editing apparatus comprising an operating device for setting a divide point of a particular data file recorded in the data area, an editing device for editing the added attribute file and the management data corresponding to the divide point of the data file set by the operating device, a generating device for generating an attribute file of the data file on the backward side of the divide point set by the operating device, and a recording device for recording the management data edited by the editing device to the management area and the attribute file added to the forward side data file to the data area.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings(s), in which:

FIG. 11 depicts the overall data structure of a reproduction management file PBLIST in accordance with the present invention;

FIG. 12A depicts a detailed data structure of a header portion of the reproduction management file PBLIST in accordance with the present invention;

FIG. 12B depicts a detailed data structure of a main data portion of the reproduction management file PBLIST in accordance with the present invention;

FIG. 12C depicts a detailed data structure of an additional information data portion of the reproduction management file PBLIST in accordance with the present invention;

FIGS. 13, 14, and 15 form a table listing key code values for identifying the type of information stored in an additional information data portion in accordance with the present invention;

FIG. 17 depicts a detailed data structure of an ATRAC3 data file in accordance with the present invention;

FIG. 18 depicts a data structure of an upper portion of the attribute header of an ATRAC3 data file in accordance with the present invention;

FIG. 19 depicts a data structure of a middle portion of the attribute header of an ATRAC3 data file in accordance with the present invention;

FIG. 20 is a correlation table for correlating record modes, record time, and other information in accordance with the present invention;

FIG. 21 is a table showing copy control states in accordance with the present invention;

FIG. 22 depicts a data structure of a lower portion of the attribute header that composes an ATRAC3 data file in accordance with the present invention;

FIG. 23 depicts a data structure of a header of a data block of an ATRAC3 data file in accordance with the present invention;

FIG. 27 depicts a detailed data structure of the track information management file TRKLIST.MSF according to an embodiment of the present invention;

FIG. 28 depicts a detailed data structure of NAME1 for managing a name according to an embodiment of the present invention;

FIG. 29 depicts a detailed data structure of NAME2 for managing a name according to an embodiment of the present invention;

FIG. 30 depicts a detailed data structure of an ATRAC3 data file A3Dnnnnn.MSA according to an embodiment of the present invention;

FIGS. 31 and 32 depict a detailed data structure of INFLIST.MSF that represents additional information according to an embodiment of the present invention;

DETAILED DESCRIPTION OF THE PREFERRED EMBODIMENTS

Figure 1:
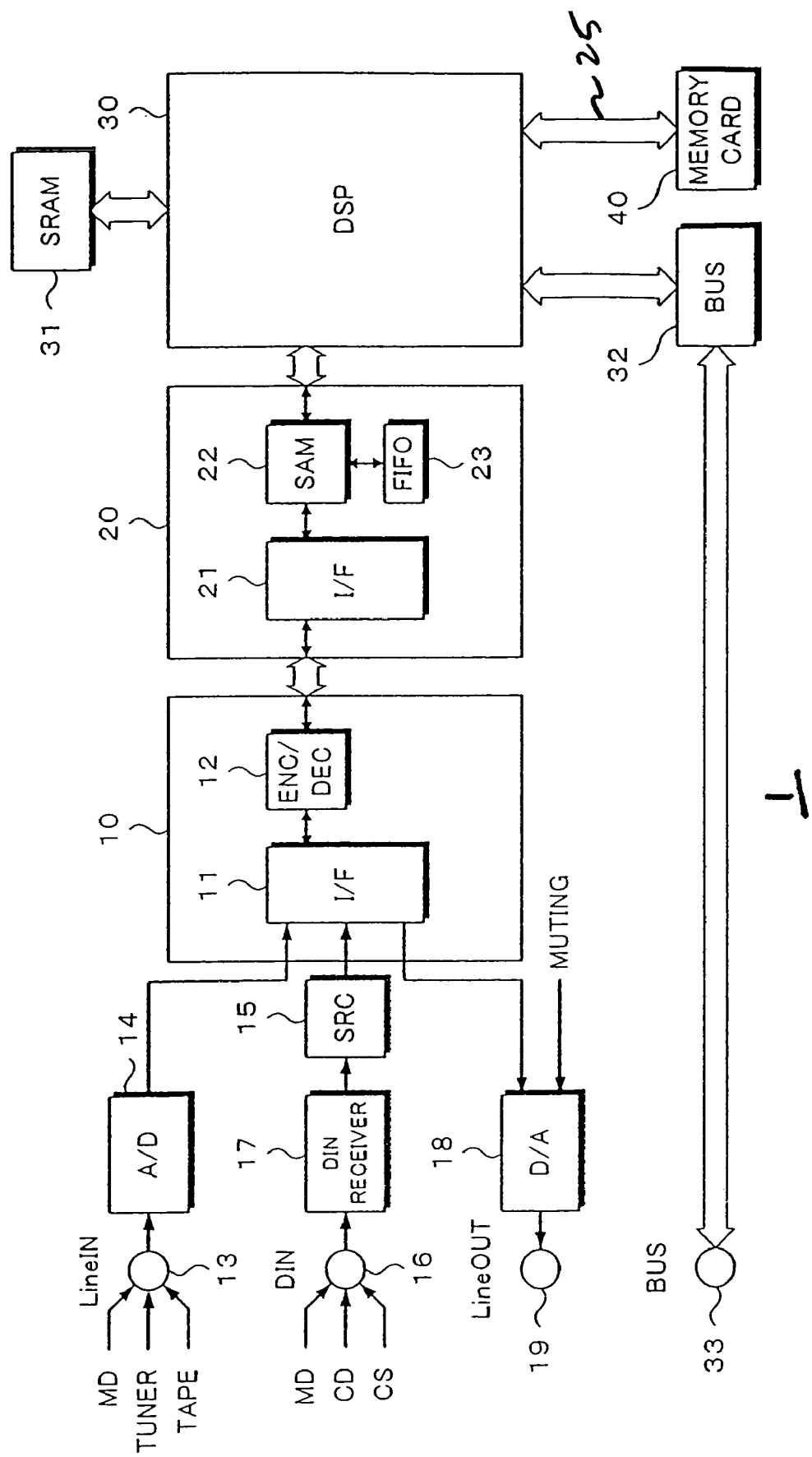
FIG. 1 depicts the structure of a digital audio recorder/player using a nonvolatile memory card in accordance with the present invention.

FIG. 1 is a block diagram showing the structure of a digital audio recorder/player 1 according to a preferred embodiment of the present invention. Digital audio recorder/player 1 records and reproduces a digital audio signal using a detachable memory card 40. Recorder/player 1 may be a part of an audio system along with an amplifying unit (not shown), speakers (not shown), a CD player (not shown), an MD recorder (not shown), a tuner (not shown), and so forth. However, it should be noted that the present invention may be applied to other types of audio recorders/players. For instance, recorder/player 1 may be a portable device. In addition, the present invention may be applied to a set top box that records digital audio data that is circulated via satellite data communication, digital broadcast, or the Internet, etc. Moreover, the present invention may be applied to a system that records/reproduces moving picture data and still picture data rather than audio data. The system according to an embodiment of the present invention may also record and reproduce additional information, such as picture and text, other than a digital audio signal.

As shown in FIG. 1, recorder/player 1 comprises an audio encoder/decoder integrated circuit ("IC") 10, a security IC 20, and a Digital Signal Processor ("DSP") 30. Each of these devices is, preferably, a one-chip IC. Recorder/player 1 also includes an interface to detachable memory card 40. Memory card 40 is also, preferably, a one-chip IC comprising flash memory (nonvolatile memory) (not shown), a memory control block (not shown), and a security block (not shown). The security block includes a Data Encryption Standard ("DES") encrypting circuit. According to the preferred embodiment, recorder/player 1 may use a microcomputer instead of DSP 30.

Audio encoder/decoder IC 10 has an audio interface 11 and an encoder/decoder block 12. Encoder/decoder block 12 encodes digital audio data in accordance with a highly efficient encoding method and writes the encoded data to memory card 40. In addition, encoder/decoder block 12 decodes encoded data read from memory card 40. The highly efficient ATRAC3 format encoding method, which is a modification of the Adaptive Transform Acoustic Coding ("ATRAC") format used for MDs, may be used.

In the ATRAC3 format, audio data sampled at 44.1 kHz and quantized with 16 bits is encoded with high efficiency. In the ATRAC3 format, the minimum data unit of audio data for processing is a sound unit ("SU"). One SU contains data of 1024 samples (1024×16 bits×2 channels) that is compressed to data of several hundred bytes. The duration of 1 SU is around 23 msec. Under this highly efficient encoding method, the size of compressed data is around 10 times smaller than that of original data. As compared to the ATRAC1 format used in MDs, an audio signal compressed and decompressed according to the ATRAC3 format is less deteriorated in audio quality.

Illustratively, a line input selector 13 selectively supplies a reproduction output signal of an MD, an output signal of a tuner, or a reproduction output signal of a tape to an Analog-to-Digital ("A/D") converter 14. A/D converter 14 converts the input line signal to a digital audio signal (sampling frequency=44.1 kHz; the number of quantizing bits=16). A digital input selector 16 selectively supplies a digital output signal of an MD, a CD, or a CS (Satellite Digital Broadcast) to a digital input receiver 17. The digital input signal is transmitted through, for example, an optical cable. An output signal of digital input receiver 17 is supplied to a sampling rate converter 15. Sampling rate converter 15 converts the digital input signal into a digital audio signal (sampling frequency=44.1 kHz; the number of quantizing bits=16).

Encoder/decoder block 12 of audio encoder/decoder IC 10 encodes the input signal and supplies encoded data to a DES encrypting circuit 22 through an interface 21 of security IC 20. DES encrypting circuit 22 comprises a First-In-First-Out ("FIFO") 23, and is disposed so as to protect copyrights on content data. DES encrypting circuit 22 may include a plurality of master keys (not shown), an apparatus-unique storage key (not shown), and a random number generating circuit. DES encrypting circuit 22 may also share an authenticating process and a session key with memory card 40, which, as described above, comprises its own DES encrypting circuit (not shown). In addition, DES encrypting circuit 22 may re-encrypt data using its storage key.

The encrypted audio data that is output from DES encrypting circuit 22 is supplied to DSP 30. DSP 30 communicates with memory card 40 through a bidirectional serial interface 25. In this illustrative embodiment, memory card 40 is attached to an attaching/detaching mechanism (not shown) of recorder/player 1. DSP 30 writes the encrypted data to flash memory 42 of memory card 40. The encrypted data is serially transmitted between DSP 30 and memory card 40. In addition, an external Static Random Access Memory ("SRAM")

31 is connected to DSP 30. SRAM 31 provides recorder/player 1 with a sufficient storage capacity so as to control memory card 40.

A bus interface 32 is connected to DSP 30. Data is supplied from an external controller (not shown) to DSP 30 through a bus 33 and bus interface 32. The external controller controls all operations of the audio system. The external controller supplies data such as a record command or a reproduction command that is generated corresponding to a user's operation through an operation portion to DSP 30 through bus interface 32. In addition, the external controller supplies additional information such as image information and character information to DSP 30 through bus interface 32. Bus 33 is a bidirectional communication path. Additional information that is read from memory card 40 is supplied to the external controller through DSP 30, bus interface 32, and bus 33. In reality, the external controller is disposed in, for example, an amplifying unit of the audio system. In addition, the external controller causes a display portion to display additional information, for example, the operation state of recorder/player 1, and so forth. The display portion is shared by the audio system. Since data that is exchanged through bus 33 is not copyright protected data, it is not encrypted.

The encrypted audio data that is read from memory card 40 by DSP 30 is decrypted by security IC 20. Audio encoder/decoder IC 10 decodes the encoded data according to the ATRAC3 format. Output data of audio encoder/decoder 10 is supplied to a Digital-to-Analog ("D/A") converter 18. D/A converter 18 converts the output data of audio encoder/decoder 10 into an analog signal. The analog audio signal is supplied to a line output terminal 19.

The analog audio signal is supplied to an amplifying unit (not shown) through line output terminal 19. The analog audio signal is reproduced from a speaker or a head set. The external controller supplies a muting signal to D/A converter 18. When the muting signal represents a mute-on state, the external controller prohibits the audio signal from being outputted from line output terminal 19.

Figure 2:
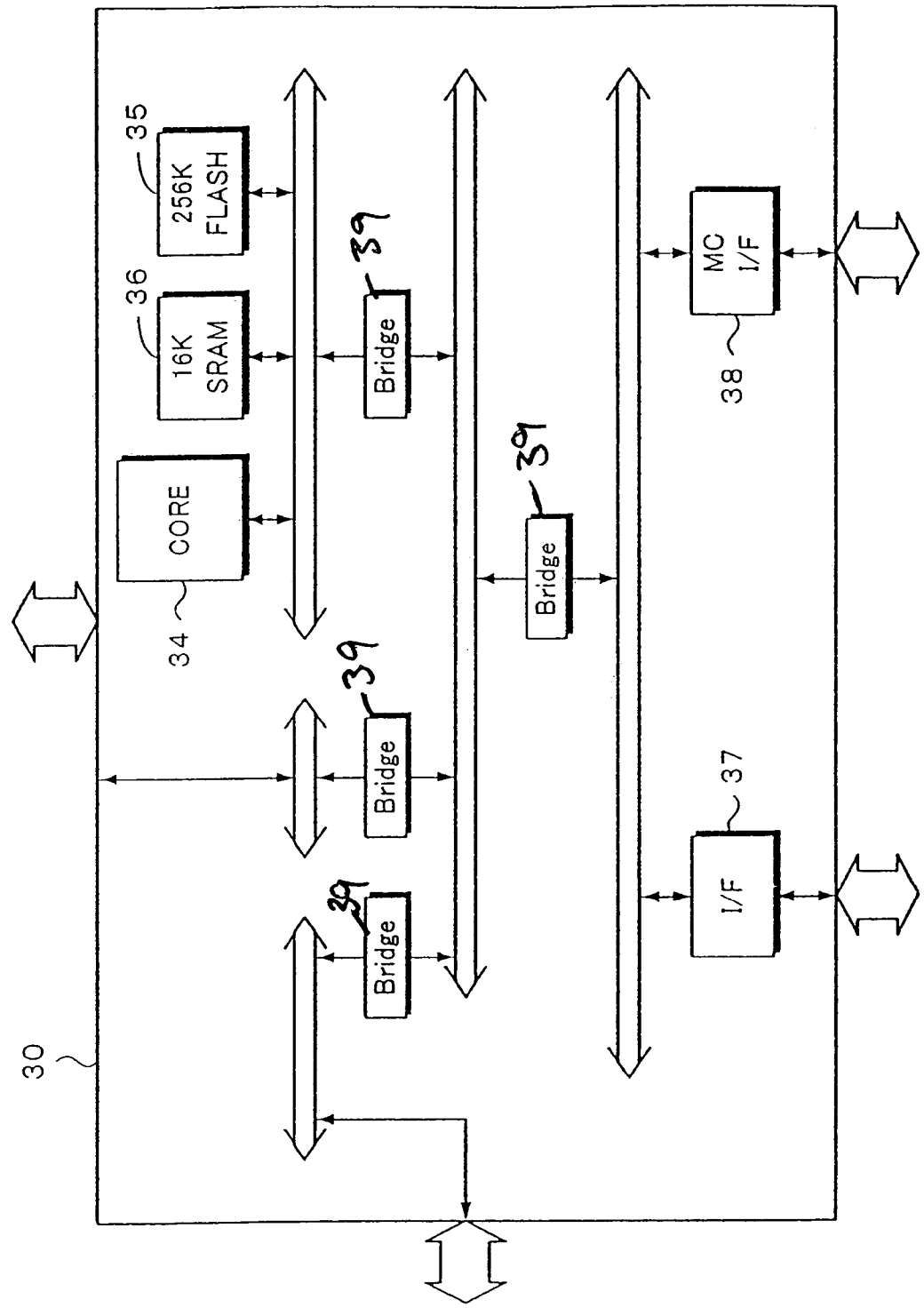
FIG. 2 depicts the internal structure of a digital signal processor in accordance with the present invention.

FIG. 2 is a block diagram showing the internal structure of DSP 30. Referring to FIG. 2, DSP 30 comprises a core 34, a flash memory 35, an SRAM 36, a bus interface 37, a memory card interface 38, and inter-bus bridges (collectively denoted 39). DSP 30 has the same function as a microcomputer. Core 34 is equivalent to a CPU. Flash memory 35 stores a program that causes DSP 30 to perform predetermined processes. SRAM 36 and external SRAM 31 are used as RAM for recorder/player 1.

DSP 30 controls a writing process for writing encrypted audio data and additional information to memory card 40 corresponding to an operation signal such as a record command received through bus interfaces 32 and 37, and a reading process for reading same therefrom. In other words, DSP 30 is disposed between the application software side of the audio system, which records/reproduces audio data and additional information, and memory card 40. DSP 30 is operated when memory card 40 is accessed. In addition, DSP 30 is operated by software, such as a file system.

DSP 30 manages files stored in memory card 40 with the FAT system used in personal computers. In addition to the file system, according to the preferred embodiment of the present invention, a management file is used. The management file is used to manage data files stored in memory card 40 and will be described in further detail below. The management file, as the first file management information, is used to manage audio data files. On the other hand, the FAT, as the second file management information, is used to manage all files including audio data files and management files stored in the flash memory of memory card 40. The management file is stored in memory card 40. The FAT is written to the flash memory along with the route directory and so forth before memory card 40 is shipped to a user. The details of the FAT will be described later.

According to an embodiment of the present invention, in order to protect copyrights on data, particularly audio data, such data that has been compressed corresponding to the ATRAC3 format is encrypted. On the other hand, since it is not necessary to protect any copyrights on the management file, the management file is not encrypted. There are two types of memory cards, an encryption type and a non-encryption type. However, a memory card for use with recorder/player 1 that records copyright protected data is limited to the encryption type.

Non-copyrighted voice and image data recorded by users are recorded on non-encryption type memory cards.

Figure 3:
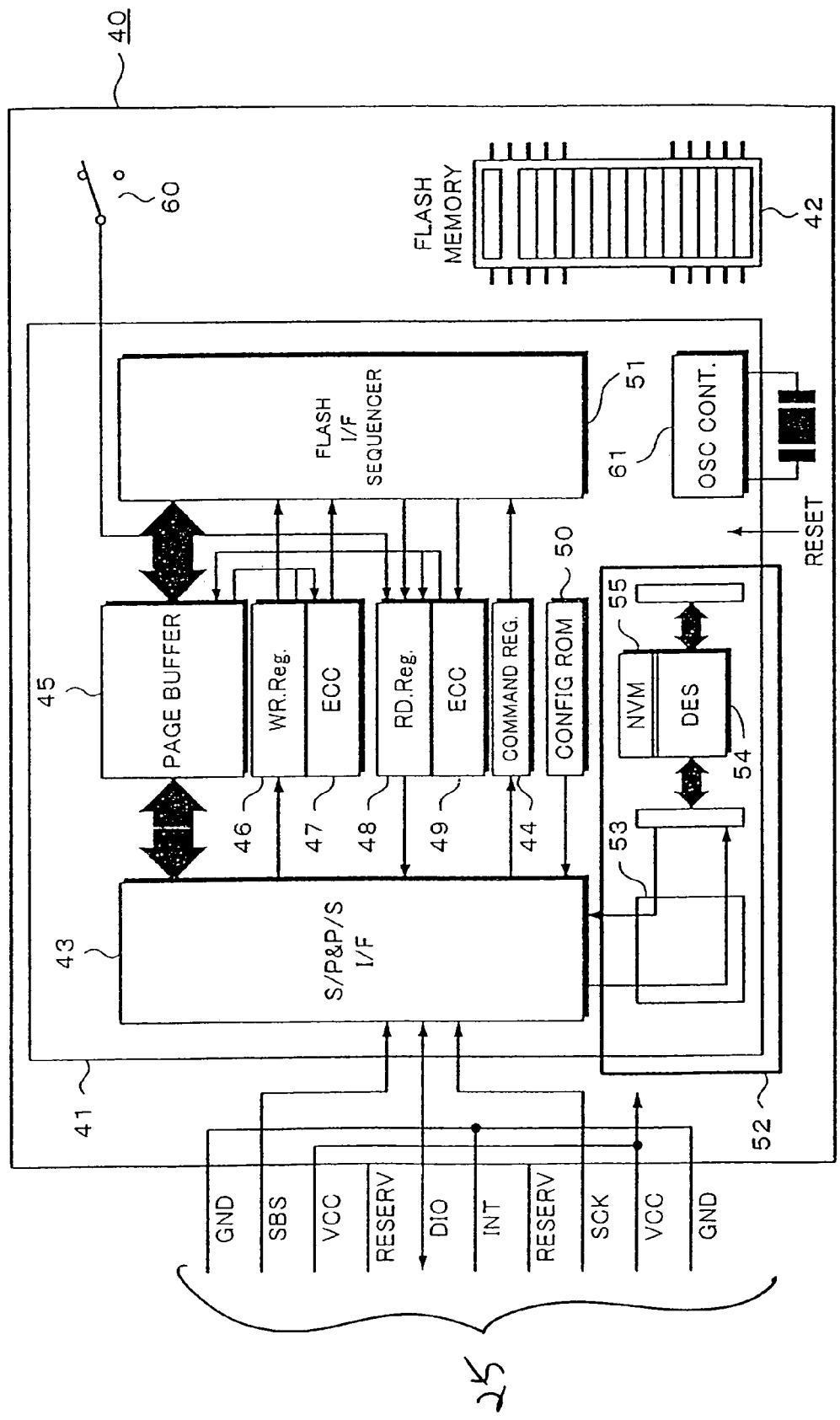
FIG. 3 depicts the internal structure of a memory card in accordance with the present invention.

FIG. 3 is a block diagram showing the internal structure of memory card 40. Memory card 40 comprises a control block 41 and a flash memory 42 that are structured as a one-chip IC. Bidirectional serial interface 25 is disposed between DSP 30 of recorder/player 1 and memory card 40. Bidirectional serial interface 25 is composed of ten lines, that is, a clock line SCK for transmitting a clock signal that is transmitted along with data, a status line SBS for transmitting a status signal, a data line DIO for transmitting data, an interrupt line INT, two GND lines, two INT lines, and two reserved lines.

The clock line SCK is used for transmitting a clock signal in synchronization with data. The status line SBS is used for transmitting a status signal that represents the status of memory card 40. The data line DIO is used for inputting and outputting a command and encrypted audio data. The interrupt line INT is used for transmitting an interrupt signal that causes memory card 40 to interrupt DSP 30 of recorder/player 1. When memory card 40 is attached to recorder/player 1, it generates the interrupt signal. According to an embodiment, the interrupt signal is transmitted through the data line DIO, and the interrupt line INT is grounded.

A serial/parallel converting, parallel/serial converting, and interface block ("S/P, P/S, and I/F block") 43 is an interface between DSP 30 of recorder/player 1 and control block 41 of memory card 40. S/P, P/S, and IF block 43 converts serial data received from DSP 30 of recorder/player 1 into parallel data. In addition, S/P, P/S, and IF block 43 converts parallel data of control block 41 into serial data and supplies the serial data to DSP 30. When S/P, P/S, and IF block 43 receives a command and data through the data line DIO, it separates them into those that are normally accessed to flash memory 42 and those that are encrypted.

In the format in which data is transmitted through the data line DIO, data is transmitted after a command is transmitted. S/P, P/S, and IF block 43 detects the code of a command and determines whether the command and data are those that are normally accessed or those that are encrypted. Corresponding to the determined result, S/P, P/S, and IF block 43 stores a command that is normally accessed to a command register 44 and stores data that is normally accessed to a page buffer 45 and a write register 46. In association with write register 46, memory card 40 has an error correction code encoding circuit 47. Error correction code encoding circuit 47 generates a redundant code that is an error correction code for data temporarily stored in page buffer 45.

Output data of command register 44, page buffer 45, write register 46, and error correction code encoding circuit 47 is supplied to a flash memory interface and sequencer ("memory I/F and sequencer") 51. Memory IF and sequencer 51 is an interface coupled to flash memory 42 and controls data exchanged between flash memory 42 and control block 41. For example, data may be written to flash memory 42 through memory IF and sequencer 51.

Audio data that has been compressed corresponding to the ATRAC3 format and written to flash memory 42 (hereinafter, this audio data is referred to as ATRAC3 data) is encrypted by security IC 20 of recorder/player 1 and a security block 52 of memory card 40 so as to protect copyrights on the ATRAC3 data. Security block 52 comprises a buffer memory 53, a DES encrypting circuit 54, a nonvolatile memory 55, and so forth.

Security block 52 of memory card 40 includes a plurality of authentication keys and a unique storage key assigned to memory card 40. Nonvolatile memory 55 stores a key necessary for encrypting data. The key stored in nonvolatile memory 55 cannot be analyzed. According to an embodiment, for example, a storage key is stored in nonvolatile memory 55. Security block 52 also has a random number generating circuit (not shown). Security block 52 authenticates recorder/player 1 and shares a session key therewith. In addition, security block 52 re-encrypts content data with the storage key through DES encrypting circuit 54.

For example, when memory card 40 is attached to recorder/player 1, they are mutually authenticated. In other words, security IC 20 of recorder/player 1 and security block 52 of memory card 40 mutually authenticate each other. When recorder/player 1 has authenticated memory card 40 as an acceptable memory card and memory card 40 has authenticated recorder/player 1 as an acceptable recorder/player, they are mutually authenticated. After the mutual authenticating process has been successfully performed, recorder/player 1 and memory card 40 generate respective session keys and share them with each other. Whenever recorder/player 1 and memory card 40 authenticate each other, they generate respective session keys.

When content data is to be written to memory card 40, recorder/player 1 encrypts a contents key with a session key and supplies the encrypted data to memory card 40. Memory card 40 decrypts the contents key with the session key, re-encrypts the contents key with a storage key, and supplies the encrypted contents key to recorder/player 1. The storage key is a key unique to memory card 40. When recorder/player 1 receives the encrypted contents key, it performs a formatting process for the encrypted contents key, and writes the encrypted contents key and the encrypted content data to memory card 40.

In the above section, a writing process for memory card 40 was described. A reading process for memory card 40 will now be described. Data read from flash memory 42 is supplied to page buffer 45, a read register 48, and an error correction circuit 49 through memory IF and sequencer 51. Error correction circuit 49 corrects an error(s) of the data stored in page buffer 45. Output data of page buffer 45 that has been error-corrected and the output data of read register 48 are supplied to S/P, P/S, and IF block 43. The output data of S/P, P/S, and IF block 43 is supplied to DSP 30 of recorder/player 1 through serial interface 25.

When data is read from memory card 40, the contents key encrypted with the storage key and the contents encrypted with the block key are read from flash memory 42. Security block 52 decrypts the contents key with the storage key. Security block 52 re-encrypts the decrypted contents key with the session key and transmits the re-encrypted contents key to recorder/player 1. Recorder/player 1 decrypts the contents key with the received session key and generates a block key with the decrypted contents key. Recorder/player 1 successively decrypts the encrypted ATRAC3 data.

A CONFIG ROM 50 is a memory that stores partition information, various types of attribute information, and so forth. Memory card 40 also has an erase protection switch 60. When switch 60 is in an erase protection position, memory card 40 is prohibited from erasing data stored in flash memory 42 even if a command for causing memory card 40 to erase the data is supplied from recorder/player 1 to memory card 40. An oscillator, OSC CONT 61 generates a clock signal which may be utilized as a reference for the timing of processes performed by memory card 40.

Figure 4:
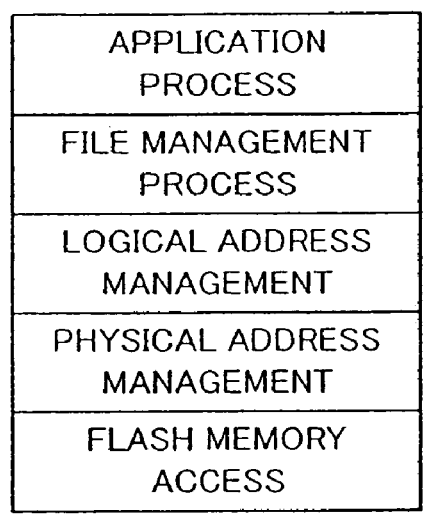
FIG. 4 depicts the file management structure of a memory card as a storage medium in accordance with the present invention.

FIG. 4 is a schematic diagram showing the hierarchy of the file system processes of a computer system that uses a memory card, e.g., memory card 40, as a storage medium. As shown therein, the top hierarchical level is an application process layer. The application process layer is followed by a file management process layer, a logical address management layer, a physical address management layer, and a flash memory access layer. In the above-mentioned hierarchical structure, the file management process layer is the FAT file system. Physical addresses are assigned to individual blocks of flash memory 42 in memory card 40. The relationship between the blocks of flash memory 42 and the physical addresses thereof does not vary. Logical addresses are addresses that are logically handled on the file management process layer.

Figure 5:
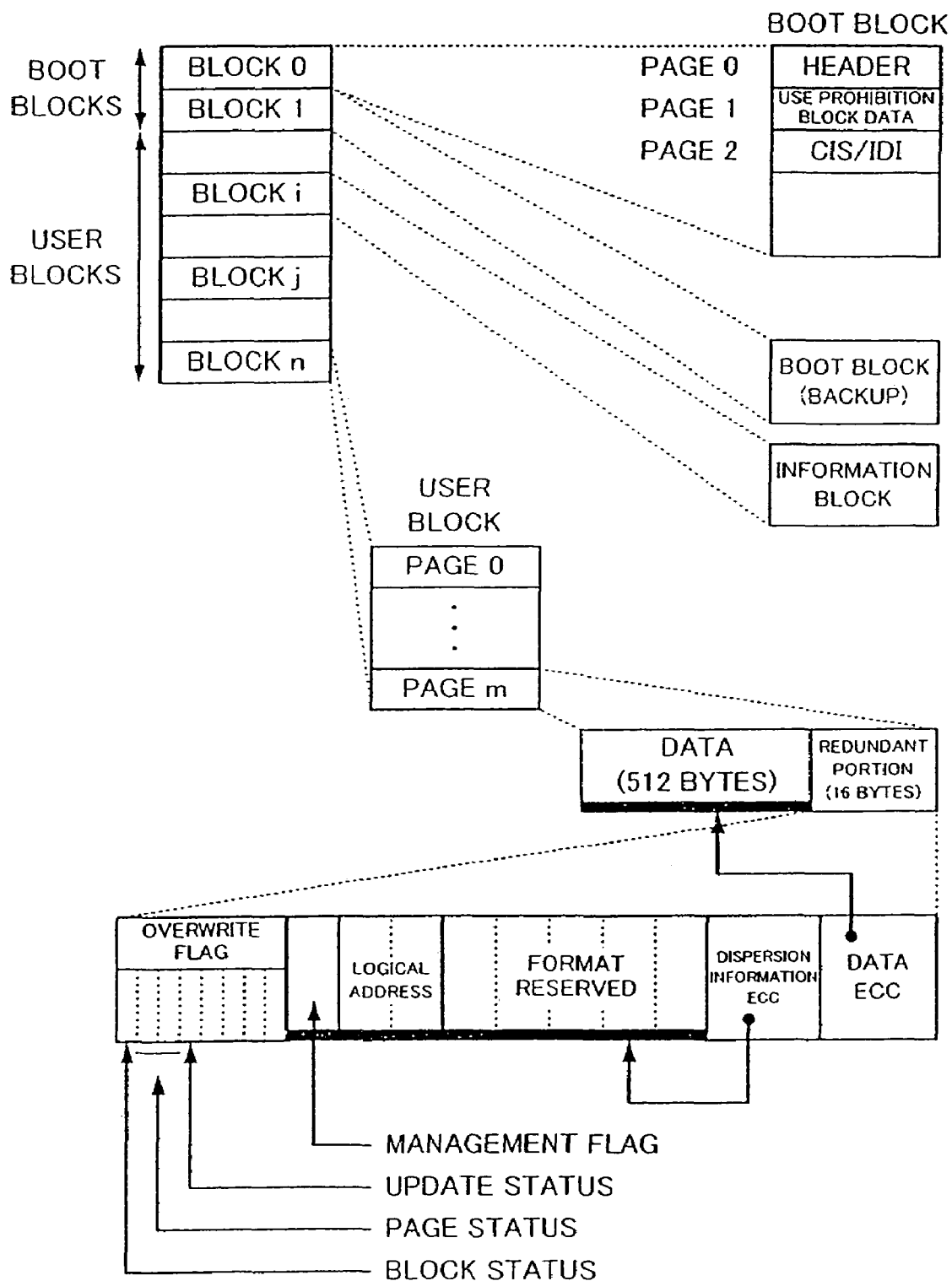
FIG. 5 depicts the physical structure of data in a flash memory of a memory card in accordance with the present invention.

FIG. 5 is a schematic diagram showing the physical structure of data handled in flash memory 42 of memory card 40. In memory 42, a data unit (referred to as a segment) is divided into a predetermined number of blocks (fixed length). One block is divided into a predetermined number of pages (fixed length). In flash memory 42, data is erased one block at a time. Data is written to flash memory 42 or read therefrom one page at a time. The size of each block is the same. Likewise, the size of each page is the same. One block is composed of page 0 to page m. One block may have a storage capacity of 8 KB (kilobytes) or 16 KB and one page may have a storage capacity of 512 B (bytes). When one block has a storage capacity of 8 KB, the total storage capacity of flash memory 42 is 4 MB (512 blocks) or 8 MB (1024 blocks). When one block has a storage capacity of 16 KB, the total storage capacity of flash memory 42 is 16 MB (1024 blocks), 32 MB (2048 blocks), or 64 MB (4096 blocks).

One page is composed of a data portion of 512 bytes and a redundant portion of 16 bytes. The first three bytes of the redundant portion is an overwrite portion that is rewritten whenever data is updated. The first three bytes successively contain a block status area, a page status area, and an update status area. The remaining 13 bytes of the redundant portion are fixed data that depends on the contents of the data portion. The 13 bytes contain a management flag area (1 byte), a logical address area (2 bytes), a format reserve area (5 bytes), a dispersion information Error-Correcting Code ("ECC") area (2 bytes), and a data ECC area (3 bytes). The dispersion information ECC area contains redundant data for an error correction process for the management flag area, the logical address area, and the format reserve area. The data ECC area contains redundant data for an error correction process for the data in the 512-byte data portion.

The management flag area contains a system flag (1: user block, 0: boot block), a conversion table flag (1: invalid, 0: table block), a copy prohibition flag (1: copy allowed, 0: copy not allowed), and an access permission flag (1: free, 0: read protect).

The first two blocks—blocks 0 and 1 are boot blocks. Block 1 is a backup of block 0. The boot blocks are top blocks that are valid in memory card 40. When memory card 40 is attached to recorder/player 1, the boot blocks are accessed first. The remaining blocks are user blocks. Page 0 of the boot block contains a header area, a system entry area, and a boot and attribute information area. Page 1 of the boot block contains a prohibited block data area. Page 2 of the boot block contains a CIS (Card Information Structure)/IDI (Identify Drive Information) area.

The header area of the boot block contains a boot block ID and a number of effective entries. The system entries are the start position of prohibited block data, the data size thereof, the data type thereof, the data start position of the CIS/IDI area, the data size thereof, and the data type thereof. The boot and attribute information contains memory card type (read only type, rewritable type, or hybrid type), the block size, the number of blocks, the number of total blocks, the security/non-security type, the card fabrication data (date of fabrication), and so forth.

Since flash memory 42 has a restriction for the number of times it can be rewritten because of the deterioration of its insulation film, it is necessary to prevent repeated access to only a particular storage area (block). Thus, when data at a particular logical address stored at a particular physical address is to be rewritten, updated data of a particular block is written to an unused block rather than the original block, where data it replaces is stored. Thus, after data is updated, the relation between the logical address and the physical address changes. This process is referred to as a swap process. Consequently, the same block is prevented from being overused for storing frequently accessed data. Thus, the service life of flash memory 42 is prolonged.

The logical address is associated with data written to the block. Even if the block for the original data is different from the block for the updated data, the address on the FAT for the data does not change. Thus, the same data can be properly accessed. However, since the swap process is performed, a conversion table that correlates logical addresses and physical addresses is required (this table is referred to as logical-physical address conversion table). With reference to the logical-physical address conversion table, a physical address corresponding to a logical address designated on the FAT is obtained. Thus, a block designated with a physical address can be accessed.

DSP 30 stores the logical-physical address conversion table in SRAM 31. When the available storage capacity of SRAM 31 is small, the logical-physical address conversion table may be stored to flash memory 42. The logical-physical address conversion table correlates logical addresses (2 bytes) sorted in ascending order with physical addresses (2 bytes). Since the maximum storage capacity of flash memory 42 is 128 MB (8192 blocks), 8192 addresses can be assigned with two bytes. The logical-physical address conversion table is managed for each segment. Thus, the size of the logical-physical address conversion table is proportional to the storage capacity of flash memory 42. When the storage capacity of flash memory 42 is 8 MB (two segments), two pages are used as the logical-physical address conversion table for each of the segments. When the conversion table is stored in flash memory 42, a predetermined one bit of the management flag area in the redundant portion in each page represents whether or not the current block is a block containing the logical-physical address conversion table.

Memory card 40, as described above, may be used with the FAT file system of a personal computer system as with a disc-shaped recording medium. Flash memory 42 has an IPL area, a FAT area, and a route directory area (not shown in FIG. 5). The IPL area contains the address of a program to be initially loaded to the memory, e.g., SRAM 31, of recorder/player 1. In addition, the IPL area contains various types of memory information. The FAT area contains information with respect to blocks (clusters). The FAT has defined unused blocks, next block number, defective blocks, and last block number. The route directory area contains directory entries that are a file attribute, an update date [day, month, year], file size, and so forth.

Next, with reference to FIG. 6, a managing method using the FAT table will be described.

Figure 6:
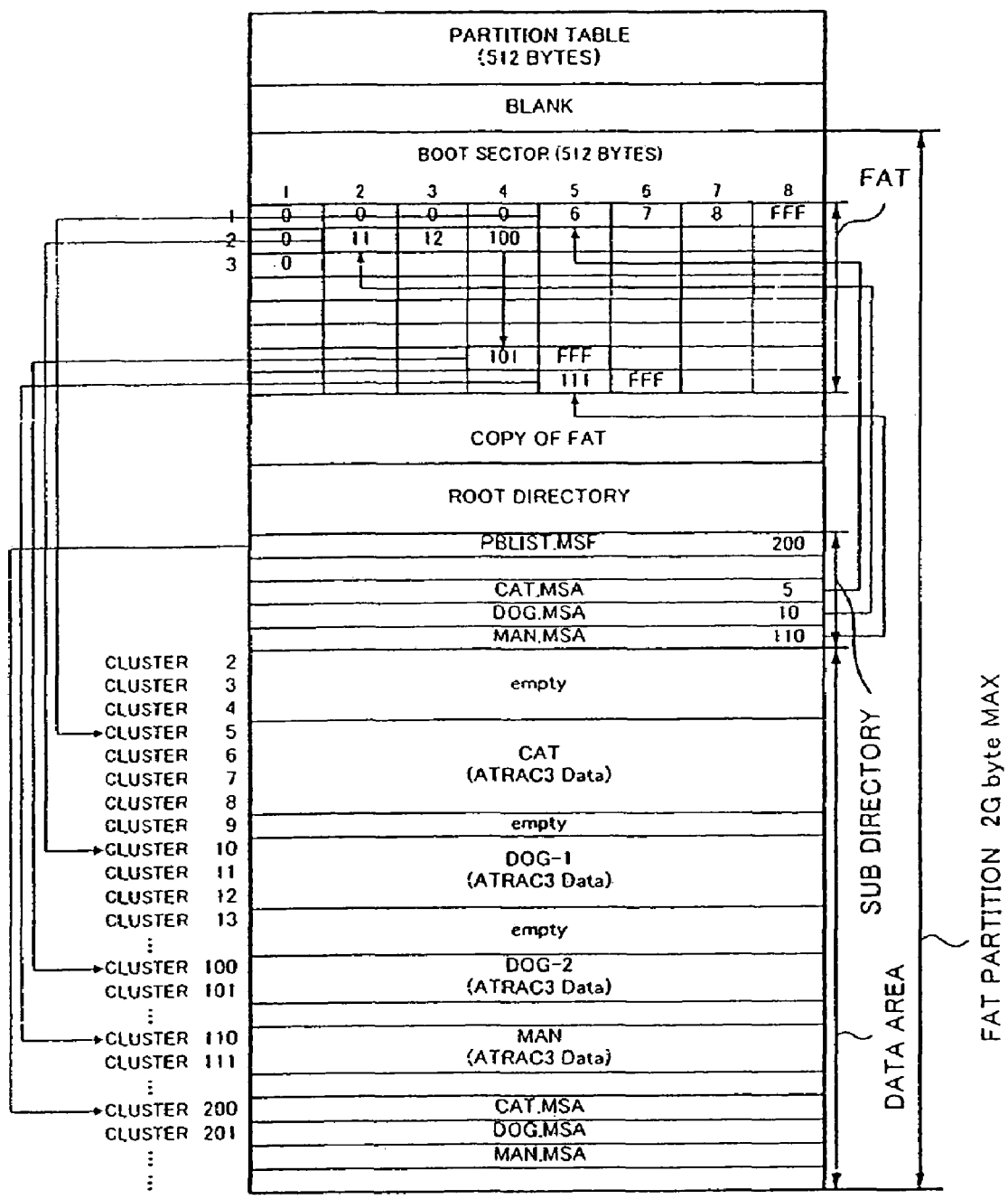
FIG. 6 illustrates the data structure of a memory card in accordance with the present invention.

FIG. 6 is a schematic diagram showing a memory map. The top area of the memory map is a partition table portion. The partition table portion is followed by a blank area, a boot sector, a FAT area, a FAT backup area, a root directory area, a sub directory area, and a data area. On the memory map, logical addresses have been converted into physical addresses corresponding to the logical-physical address conversion table.

The boot sector, the FAT area, the FAT backup area, the root directory area, the sub directory area, and the data area are collectively referred to as the FAT partition area.

The partition table portion contains the start address and the end address of the FAT partition area.

Since the first track has only a partition table, there is a blank area. The boot sector contains the size of the FAT structure (12 bit FAT or 16 bit FAT), the cluster size, and the size of each area. The FAT is used to manage the position of a file recorded in the data area. The FAT copy area is a FAT backup area. The route directory area contains file names, start cluster addresses thereof, and various attributes thereof. The route directory area uses 32 bytes per file.

The sub directory area is achieved by a directory attribute file as a directory. In the illustrative embodiment shown in FIG. 6, the sub directory area has four files named PBLIST.MSF, CAT.MSA, DOG.MSA, and MAN.MSA. The sub directory area is used to manage file names and record positions on the FAT. In other words, the slot of the file name CAT.MSA is assigned address "5" on the FAT. The slot of the file name DOG.MSA is assigned address "10" on the FAT. The top slot of the file name MAN.MSA is assigned address "110" on the FAT. An area after cluster 2 is a data area designated "Empty". Audio data that has been compressed corresponding to the ATRAC3 format is recorded. Audio data with the file name CAT.MSA is recorded to clusters 5 to 8. Audio data of DOG-1 as the first half of the file with the file name DOG.MSA is recorded to clusters 10 to 12. Audio data DOG-2 as the second half of the file with the file name DOG.MSA is recorded in clusters 100 and 101. Audio data with the file name MAN.MSA is recorded in clusters 110 and 111.

An example of a single file being divided into two portions and dispersedly recorded will now be described. An area "Empty" in the data area is a recordable area. An area in and after cluster 200 is used for managing file names. The file CAT.MSA is recorded to cluster 200. The file DOG.MSA is recorded to cluster 201. The file MAN.MSA is recorded to cluster 202. When the positions of the files are changed, the area in and after cluster 200 is re-arranged. When memory card 40 is attached, the beginning and the end of the FAT partition area are recorded with reference to the top partition table portion. After the boot sector portion is reproduced, the root directory area and the sub directory area are reproduced. The slot of the reproduction management information PBLIST.MSF in the sub directory area is detected. Thus, the address of the end portion of the slot of the file PBLIST.MSF is obtained. In the illustrative embodiment, since address "200" is recorded at the end of the file PBLIST.MSF, cluster 200 is referenced.

The area in and after cluster 200 is used for managing the reproduction order of files. In the embodiment, the file CAT.MSA is the first program. The file DOG.MSA is the second program. The file MAN.MSA is the third program. After the area after cluster 200 is referenced, slots of the files CAT.MSA, DOG.MSA, and MAN.MSA are referenced. In FIG. 6, the end of the slot of the file CAT.MSA is assigned address "5". The end of the slot of the file DOG.MSA is assigned address "10". The end of the slot of the file MAN.MSA is assigned address "110". When an entry address is searched on the FAT with address "5", cluster address "6" is obtained. When an entry address is searched on the FAT with address "6", cluster address "7" is obtained. When an entry address is searched on the FAT with address "8", code "FFF", which represents the end, is obtained. Thus, the file CAT.MSA uses clusters 5, 6, 7, and 8. With reference to clusters 5, 6, 7 , and 8 in the data area, an area of ATRAC3 data with the file name CAT.MSA can be accessed.

Next, a method for searching the file DOG.MSA that has been dispersedly recorded will be described. The end of the slot of the file DOG.MSA is assigned address "10". When an entry address on the FAT is searched with address "10", cluster address "11" is obtained. When an entry address on the FAT is searched with address "11", cluster address "12" is obtained. When an entry address on the FAT is searched with address "12", cluster address "101" is obtained. When entry address "101" is referenced, code "FFF" that represents the end is obtained. Thus, the file DOG.MSA uses clusters 10, 11, 12, 100, and 101. When clusters 10, 11, and 12 are referenced, the first part of ATRAC3 data of the file DOG.MSF can be accessed. When the clusters 100 and 101 are referenced, the second part of ATRAC3 data of the file DOG.MSF can be accessed. In addition, when an entry address is searched on the FAT with address "111", cluster address "101" is obtained. When an entry address "111" is searched on the FAT, code "FFF", which represents the end, is obtained. Thus, it is clear that the file MAN.MSA uses clusters 110 and 111. As described above, data files dispersed in the flash memory can be linked and sequentially reproduced.

According to a preferred embodiment of the present invention, in addition to the file management system defined in the format of memory card 40, the management file may be used for managing tracks and parts of music files. The management file is recorded to a user block of flash memory 42 of memory card 40. Thus, as will be described later, even if the FAT of memory card 40 is destroyed, a file can be recovered.

The management file is generated by DSP 30. When the power of recorder/player 1 is turned on, DSP 30 determines whether or not memory card 40 is attached to recorder/player 1. When memory card 40 is attached, DSP 30 authenticates memory card 40. When DSP 30 has successfully authenticated memory card 40, DSP 30 reads the boot block of flash memory 42. Thus, DSP 30 reads the physical-logical address conversion table and stores the read data to SRAM 31. The FAT and the route directory have been written to flash memory 42 of memory card 40 before memory card 40 is shipped to a user. When data is recorded to memory card 40, the management file is generated.

In other words, a record command issued from a remote controller by a user or the like is supplied to DSP 30 from the external controller through bus 33 and bus interface 32. Encoder/decoder IC 10 compresses the received audio data and supplies the resultant ATRAC3 data to security IC 20. Security IC 20 encrypts the ATRAC3 data. The encrypted ATRAC3 data is recorded to flash memory 42 of memory card 40. Thereafter, the FAT and the management file are updated.

Whenever a file is updated (in reality, whenever the recording process of audio data is completed), the FAT and the management file stored in SRAMs 31 and 36 are rewritten. As memory card 40 is detached or the power of recorder/player 1 is turned off, the FAT and the management file that are finally supplied from SRAMs 31 and 36 are recorded to flash memory 42. Alternatively, whenever the recording process of audio data is completed, the FAT and the management file written in flash memory 42 may be rewritten. When audio data is edited, the contents of the management file are updated.

In the data structure, additional information is contained in the management file. The additional information is updated and recorded to flash memory 42. In another data structure of the management file, an additional information management file is generated besides the track management file. The additional information is supplied from the external controller to DSP 30 through bus 33 and bus interface 32. The additional information is recorded to flash memory 42 of memory card 40. Since the additional information is not supplied to security IC 20, it is not encrypted. As memory card 40 is detached from recorder/player 1 or the power thereof is turned off, the additional information is written from SRAM 31 of DSP 30 to flash memory 42.

Figure 7:
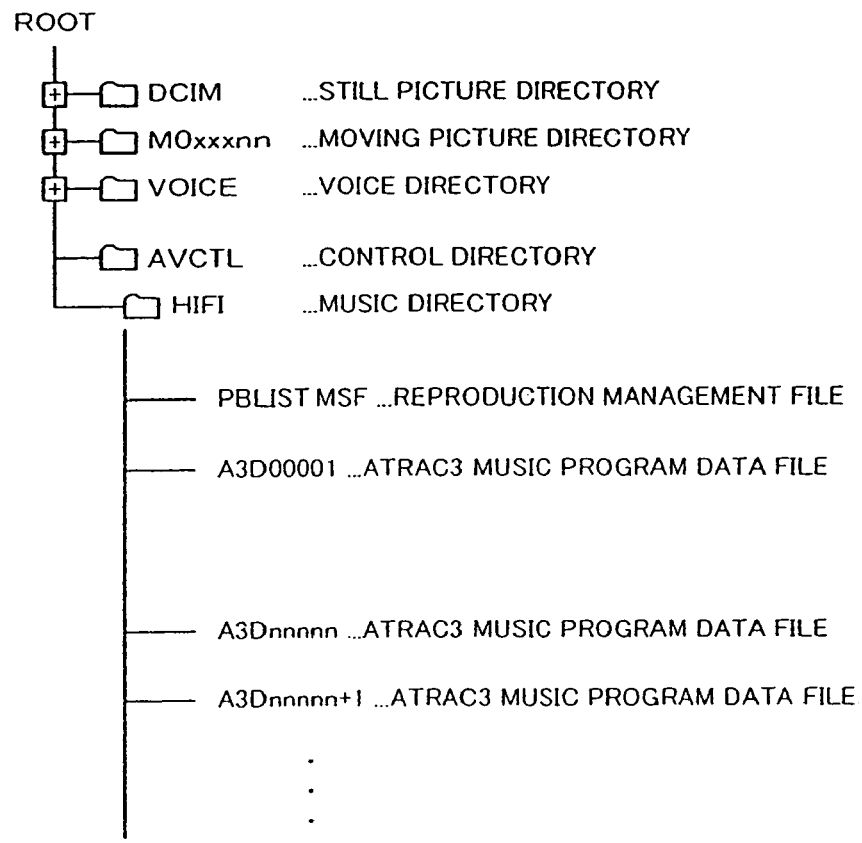
FIG. 7 illustrates a hierarchy of the file structure in a memory card in accordance with the present invention.

FIG. 7 is a diagram showing the file structure of memory card 40. The file structure includes a still picture directory, a moving picture directory, a voice directory, a control directory, and a music (HIFI) directory. Music programs may be recorded and reproduced. The music directory may have two types of files. The first type is a reproduction management file PBLIST.MSF (hereinafter, referred to as PBLIST). The other type is an ATRAC3 data file A3Dnnnn.MSA that stores encrypted music data. The music directory may store up to 400 ATRAC3 data files (namely, 400 music programs). ATRAC3 data files are registered to the reproduction management file and generated by recorder/player 1.

Figure 8:
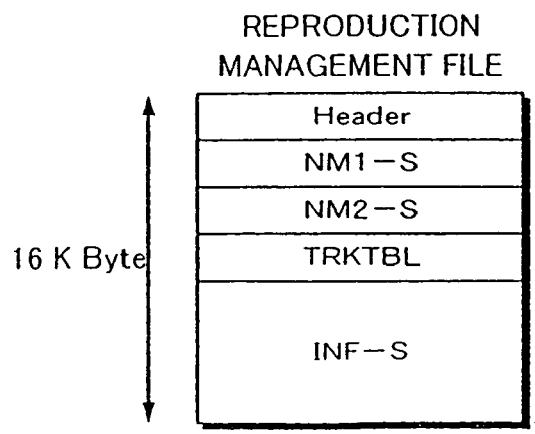
FIG. 8 depicts a data structure of a reproduction management file PBLIST.MSF that is a sub directory stored in a memory card in accordance with the present invention.
Figure 9:
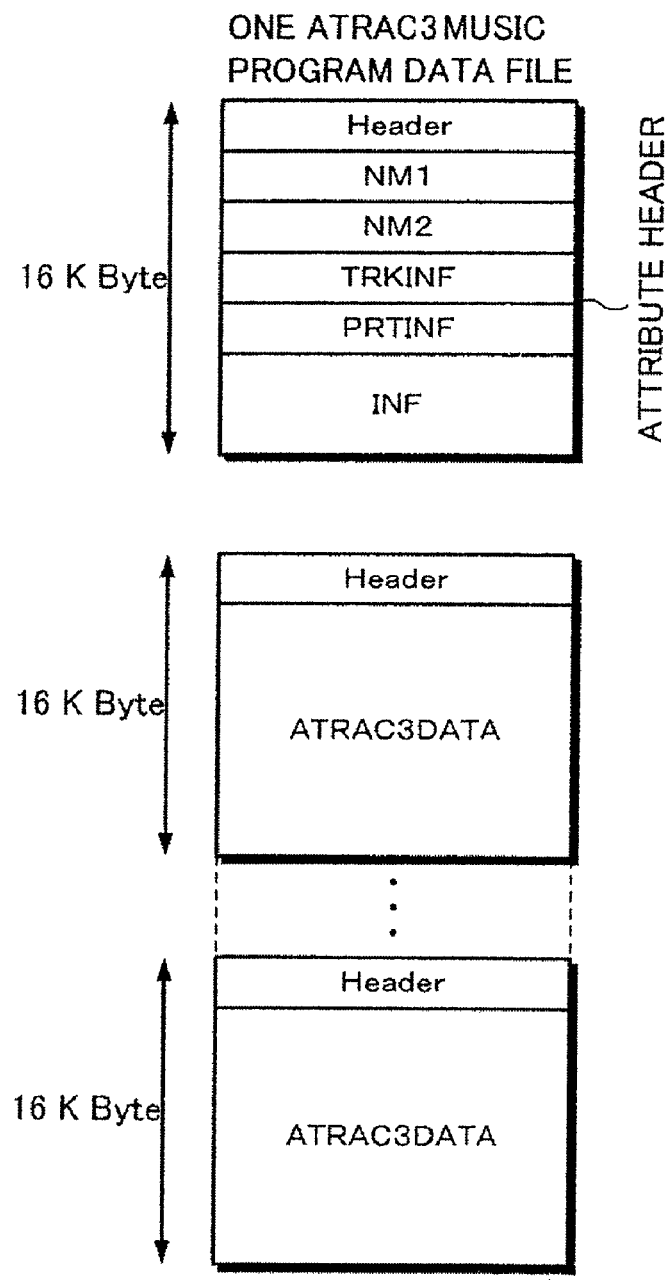
FIG. 9 depicts the data structure of an ATRAC3 data file divided into blocks of a predetermined unit length, and including an attribute header in accordance with the present invention.

FIGS. 8 and 9 show how a reproduction management file is used in implementing ATRAC3. FIG. 8 shows the structure of a reproduction management file. FIG. 9 shows the file structure of an ATRAC3 data file. An ATRAC3 data file is composed of an attribute header and an encrypted music data area for each music program. Both the reproduction management file and the ATRAC3 attribute header have a fixed file length of 16 KB (one block).

The reproduction management file shown in FIG. 8 is composed of a header, a memory card name NM-1S (for one byte code), a memory card name NM2-S (for two byte code), a program reproduction sequence table TRKTBL, and an additional information area INF-S. The attribute header (shown in FIG. 9) at the beginning of the data file is composed of a header, a program name NM1 (for one byte code), a program name NM2 (for two byte code), track information TRKINF (such as track key information), part information PRTINF, and an additional track information area INF. The header contains information on the total number of parts, the track name, the size of the additional information area, and so forth.

The attribute header is followed by ATRAC3 music data. The music data is block-segmented every 16 KB, each block starting with a header. The header contains an initial value for decrypting encrypted data. Only the music data of an ATRAC3 data file is encrypted. Thus, the reproduction management file, the header, and so forth are not encrypted.

Figure 10A:
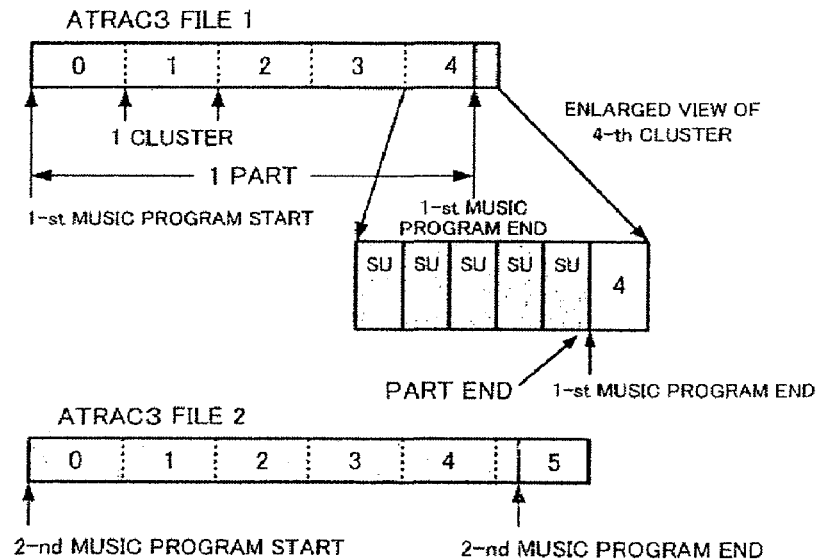
FIG. 10A depicts a file structure before two files are edited with a combining process in accordance with the present invention.
Figure 10B:
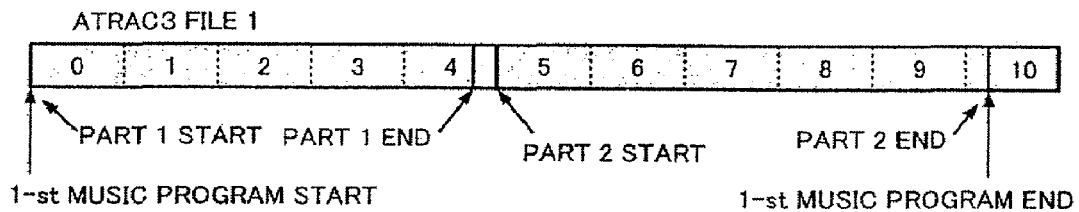
FIG. 10B depicts a file structure after two files are edited with a combining process in accordance with the present invention.
Figure 10C:
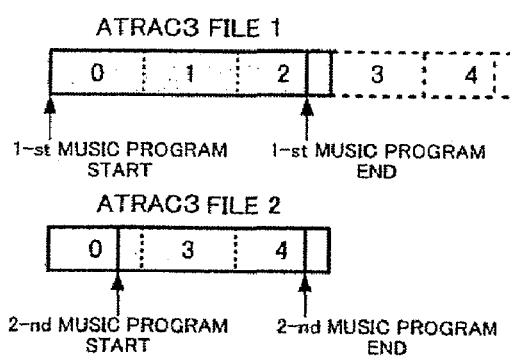
FIG. 10C depicts a file structure after one file is edited with a dividing process in accordance with the present invention.

Next, with reference to FIGS. 10A to 10C, the relation between music programs and ATRAC3 data files is described. One track is equivalent to one music program. In addition, one music program is composed of one ATRAC3 data (see FIG.

9). The ATRAC3 data file is recorded one cluster at a time into memory card 40. Each cluster has a capacity of 16 KB. Only one file is contained in each cluster. The minimum erasable unit of data for flash memory 42 is one block. A block is synonymous with a cluster or a sector.

One music program (or track) is generally recorded in one part of a track data file. However, when the program is edited, the music program may be broken into a plurality of parts. The relationship between one or more parts containing a single music program is managed with part information PRTINF stored in the attribute header of each music program (see FIG. 9). The part size is represented with part size PRTSIZE (4 bytes) of the part information PRTINF. The first two bytes of the part size PRTSIZE represents the number of total clusters in the current part. The next two bytes represent the positions of the start sound unit (SU) and the end sound unit (SU) of the first and last clusters, respectively. By this marking of parts, the movement of music data which occurs during editing can be tracked.

SU is the minimum unit of a part compressed according to the ATRAC3 format. One SU is comprised of 1024 samples at 44.1 kHz (1024×16 bits×2 channels) and can be compressed by a factor of 10. This corresponds to around 23 msec of audio. Normally, a single part contains several thousand SU. Thus, a cluster composed of 42 SU, stores about a second of audio.

Theoretically, the maximum number of parts comprising one track is 645. However, the actual number of parts usable in any given track is limited by the header, the program name, the additional data, and the size of the additional information.

FIG. 10A is a diagram showing a file structure where two music programs of a CD or the like are successively recorded. The first program (file 1) is composed of, for example, five clusters. Since one cluster does not contain two files, the second program (file 2), starts from the beginning of the next cluster. Thus, the end of part 1 (file 1) is in the middle of one cluster and the remaining area of the cluster contains no data. Likewise, the second music program (file 2) is composed of one part. In the case of file 1, the part size is 5. The first cluster starts at the 0-th SU. The last cluster ends at the 4-th SU.

There are four types of edit processes: a divide process, a combine process, an erase process, and a move process. The divide process divides one track into two portions. When the divide process is performed, the number of total tracks increases by one. In the divide process, one file is divided into two files on the file system. In this case, the reproduction management file and the FAT are also updated. The combine process combines two tracks into one track. When the combine process is performed, the number of total tracks decreases by one. In the combine process, two files are combined into one file on the file system. Thus, when the combine process is performed, the reproduction management file and the FAT are also updated. The erase process erases a track. When an erase process is performed, the number of tracks decreases by one. The move process changes the track sequence. When the erase process or the move process is performed, the reproduction management file and the FAT are, likewise, updated.

FIG. 10B is a diagram showing the result of combining the two programs (file 1 and file 2) shown in FIG. 10A. As a result of the combining process, the combined file is composed of two parts. FIG. 10C is a diagram showing the result of one program (file 1) being divided in the middle of cluster 2. As shown, file 1 is composed of clusters 0, 1, and the beginning portion of cluster 2 and file 2 is composed of the end portion of cluster 2 and clusters 3 and 4.

As described above, since the part notation is defined for the result of the combining process (see FIG. 10B), the start position of part 1, the end position of part 1, and the end portion of part 2 can be defined with SU. Thus, the music data of part 2 may not have to be moved to pack the space caused by the process. In addition, for the result of the dividing process (see FIG. 10C), data may not have to be moved and the space packed at the beginning of the file 2.

FIG. 11 is a schematic diagram showing the detailed data structure of a reproduction management file, PBLIST. FIGS. 12A and 12B show a header portion and the remaining portion, respectively, of the reproduction management file of FIG. 11. As shown by FIGS. 12A and 12B, the reproduction management file contains a 32 byte header, a name NM1-S area (256 bytes) (for memory card 40), a name NM2-S area (512 bytes), a contents key area, a MAC area, an S-YMDhms area, a reproduction sequence management table TRKTBL area (800 bytes), a memory card additional information INF-S area (14720 bytes), and a redundant header information area. The start positions for each of these areas within the reproduction management file are predefined.

As shown in FIG. 12A, the first 32 bytes of (0x0000) to (0x0010) are used for the header. Within the file, 16-byte areas are referred to as slots. The header is placed in the first and second slots indicated at 0x000 and 0x0010. The area denoted as "Reserved" is an undefined area. Normally, a null (0x00) is written in reserved areas. However, even if data is written to a reserved area, the data is ignored. The reserved areas are intended for use in future revisions of the file format. Optional areas, when not used, are treated as reserved areas. Additionally, the reproduction management file header contains the following defined areas:

=BLKID-TL0 (4 bytes)
Meaning: BLOCKID FILE ID
Function: Identifies the top of the reproduction management file.
Value: Fixed value="TL=0" (for example, 0x544C2D30)
=MCode (2 bytes)
Meaning: MAKER CODE
Function: Identifies the maker and model of recorder/player 1
Value: High-order 10 bits (Maker code); low-order 6 bits (model code).
=REVISION (4 bytes)
Meaning: Number of rewrite times of PBLIST
Function: Increments whenever the reproduction management file is rewritten.
Value: Starts at 0 and increments by 1.
=SY1C+L (2 bytes)
Meaning: Attribute of name (one byte code) of memory card 40 written in NM1-S area.
Function: Represents the character code and the language code as one byte code.
Value: Character code (C): High-order one byte
 00: Non-character code, binary number
 01: ASCII (American Standard Code for Information Interchange)
 02: ASCII+KANA
 03: Modified 8859-1
 81: MS-JIS
 82: KS C 5601-1989
 83: GB (Great Britain) 2312-80
 90: S-JIS (Japanese Industrial Standards) (for Voice)
Language code (L): Low-order one byte identifies the language based on EBU Tech 3258 standard.
 00: Not set
 08: German 09: English
0A: Spanish
0F: French
15: Italian
1D: Dutch
65: Korean
69: Japanese
75: Chinese
When data is not recorded, this area is all 0.
=SN2C+L (2 bytes)
Meaning: Attribute of name of memory card 40 in NM2-S area.
Function: Represents the character code and the language coded as one byte code.
Value: Same as SNIC+L
=SINFSIZE (2 bytes)
Meaning: Total size of additional information of memory card 40 in INF-S area.
Function: Represents the data size as an increment of 16 bytes. When data is not recorded, this area is all 0.
Value: Size: 0x000 to 0x39C (924)
=T-TRK (2 bytes)
Meaning: TOTAL TRACK NUMBER
Function: Represents the number of total tracks.
Value: 1 to 0x0190 (Max. 400 tracks)
When data is recorded, this area is all 0.
=VerNo (2 bytes)
Meaning: Format version number
Function: Represents the major version number (high order one byte) and the minor version number (low order one byte).
Value: 0x0100 (Ver 1.0)
0x0203 (Ver 2.3)
Next, areas preceded by the header are described.
=NM1-S
Meaning: Name of memory card 40 (as one byte code)
Function: Represents the name of memory card 40 as one byte code (max. 256). At the end of this area, an end code (0x00) is written. The size is calculated from the end code. When data is not recorded, null (0x00) is recorded from the beginning (0x0020) of this area for at least one byte.
Value: Various character code
=NM2-S
Meaning: Name of memory card 40 (as two-byte code)
Function: Represents the name of memory card 40 as two-byte code (max. 512). At the end of this area, an end code (0x00) is written. The size is calculated from the end code. When data is not recorded, null (0x00) is recorded from the beginning (0x0120) of this area for at least two bytes.
Value: Various character code
=CONTENTS KEY
Meaning: Value for music program. Protected with MG(M) and stored. Same as CONTENTS KEY.
Function: Used as a key necessary for calculating MAC of S-YMDhms.
Value: 0 to 0xFFFFFFFFFFFFFFFF
=MAC
Meaning: Forged copyright information check value
Function: Represents the value generated with S-YMDhms and CONTENTS KEY.
Value: 0 to 0xFFFFFFFFFFFFFFFF
=S-YMDhms (4 bytes) (Optional)
Meaning: Year, month, day, hour, minute, and second recorded by recorder/player 1 with a reliable clock.
Function: Identifies the last recorded date and time. In this case of EMD, this area is mandatory.
Value: bits 25 to 31: Year 0 to 99 (1980 to 2079)
bits 21 to 24: Month 0 to 12
bits 16 to 24: Day 0 to 3.1
bits 11 to 15: Hour 0 to 23
bits 05 to 10: Minute 0 to 59
bits 00 to 04: Second 0 to 29 (two second interval)
=TRK-nnn
Meaning: SQN (sequence) number of ATRAC3 data file reproduced.
Function: Represents FN0 of TRKINF.
Value: 1 to 400 (0x190)
When there is no track, this area is all 0.
=INF-S
Meaning: Additional information of memory card 40 (for example, information with respect to photos, songs, guides, etc.)
Function: Represents variable length additional information with a header. A plurality of types of additional information may be used. Each of the types of additional information has an ID and a data size. Each additional information area including a header is composed of at least 16 bytes and a multiple of 4 bytes. For details, see the following section.
Value: Refer to the section of "Data Structure of Additional Information".

In the last slot of the reproduction management file, copies of BLKID-TL0, MCode, and REVISION from the header are redundantly written.

If memory card 40 is accidentally detached or the power of recorder/player 1 turned off while data is being recorded into card 40, a termination error should be detected. As described above, a REVISION area is placed at the beginning and end of each block. Whenever data is rewritten, the value of the REVISION area is incremented. If a termination error occurs in the middle of writing a block, the value of the REVISION area at the beginning of the block will not match the value of the REVISION area at the end of the block. This discrepancy between the two REVISION areas allows termination errors to be determined with a high probability. When such an abnormal termination is detected; an alarm, such as an error message, is generated.

In addition, because the fixed value BLKID-TL0 is written at the beginning of one block (16 KB) the fixed value can be used as a reference for recovering data. In other words, the fixed value allows the type of the file to be determined. Because the fixed value BLKID-TL0 is redundantly written in the header and at the end of each block, reliability is secured. Alternatively, the entire reproduction management file can be redundantly recorded.

ATRAC3 data files are not redundantly recorded because the amount of data in an ATRAC3 data file is much larger than in a track information management file. Instead, COONUM0 and BLOCK SERIAL values are used to help recover lost ATRAC3 data (as will be described below). In addition, one ATRAC3 data file may be composed of a plurality of blocks that are dispersed. To identify blocks of the same file, CONNUM0 is used and to identify the order of the blocks BLOCK SERIAL is used. Likewise, as noted above, a maker code (MCode) is redundantly recorded at the beginning and the end of each block, so as to identify the maker of a file which has been improperly recorded.

FIG. 12C shows the structure of an additional information area. The additional information area is composed of a header comprised of the following data, and additional variable length data:

=INF
Meaning: FIELD ID
Function: Represents the beginning of the additional information (fixed value).
Value: 0x69
=ID
Meaning: Additional information key code
Function: Represents the category of the additional information.
Value: 0 to 0xFF
=SIZE
Meaning: Size of individual additional information
Function: Represents the size of each type of additional information. Although the data size is not limited, it should be at least 16 bytes and a multiple of 4 bytes. The rest of the data should be filled with null (0x00).
Value: 16 to 14784 (0x39C0)
=MCode
Meaning: MAKER CODE
Function: Identifies the maker and model of recorder/player 1.
Value: High-order 10 bits (maker code), low-order 10 bits (machine code).
=C+L
Meaning: Attribute of characters in data area starting from byte 12.
Function: Represents the character code and the language code as one byte code.
Value: Same as SNC+L
=DATA
Meaning: Individual additional information
Function: Represents each type of additional information with variable length data. Real data always starts from byte 12. The length (size) of the real data should be at least 4 bytes and a multiple of 4 bytes. The rest of the data area should be filled with null (0x00).
Value: Individually defined corresponding to the contents of each type of additional information.

FIG. 13 is a table that correlates key code values 0 to 63 to additional information and types thereof. Key code values 0 to 31 are assigned to music character information. Key code values 32 to 63 are assigned to Uniform Resource Locator ("URL") information (web information). The music character information and URL information contain character information of the album title, the artist name, the CM, and so forth as additional information.

FIG. 14 is a table that correlates key code values 64 to 127 to additional information and types thereof. Key code values 64 to 95 are assigned to path/others. Key code values 96 to 127 are assigned to control/numeric data. For example, ID=98 represents TOC_ID as additional information. TOC_ID represents the first music program number, the last music program number, the current program number, the total performance duration, and the current music program duration corresponding to the Table of Contents ("TOC") information of a CD.

FIG. 15 is a table that correlates key code values 128 to 159 to additional information and types thereof. Key code values 128 to 159 are assigned to synchronous reproduction information. In FIG. 15, EMD represents electronic music distribution.

Figure 16A:
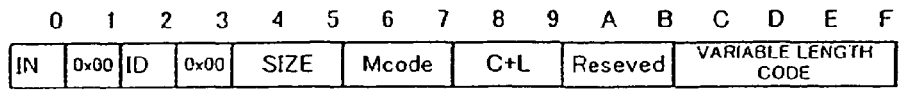
FIG. 16A depicts a data structure of additional information data in accordance with the present invention.
Figure 16B:
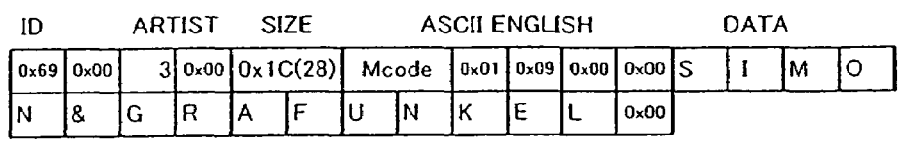
FIG. 16B depicts a data structure in accordance with the present invention wherein the additional information data is an artist name.

Next, with reference to FIGS. 16A to 16E, examples of additional information will be described. FIG. 16A shows a data structure of additional information. In FIG. 16B, key code ID=3 (artist name as additional information), SIZE=0x1C (28 bytes) which represents that the data length of additional information including the header is 28 bytes; and C+L which represents that character code C=0x01 (ASCII) and language code L=0x09 (English). Variable length data after byte 12 represents one byte data "SIMON & GRAFUNKEL" as artist name. Since the data length of the additional information should be a multiple of 4 bytes, the rest is filled with (0x00).

Figure 16C:
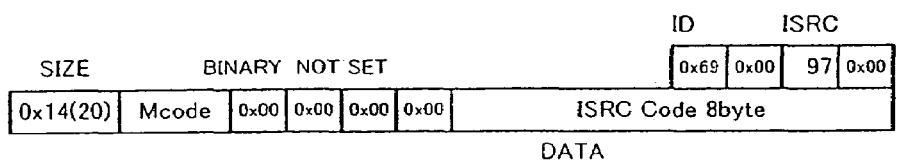
FIG. 16C depicts a data structure in accordance with the present invention wherein the additional information data is a copyright code.

In FIG. 16C, key code ID=97 which represents ISRC (International Standard Recording Code: Copyright code) as additional information, SIZE=0x14 (20 bytes) which represents that the data length of the additional information is 20 bytes, and C=0x00 and L=0x00 which represents that characters and language have not been set. Thus, the data is binary code. The variable length data is an eight-byte ISRC code representing copyright information (nation, copyright owner, recorded year, and serial number).

Figure 16D:
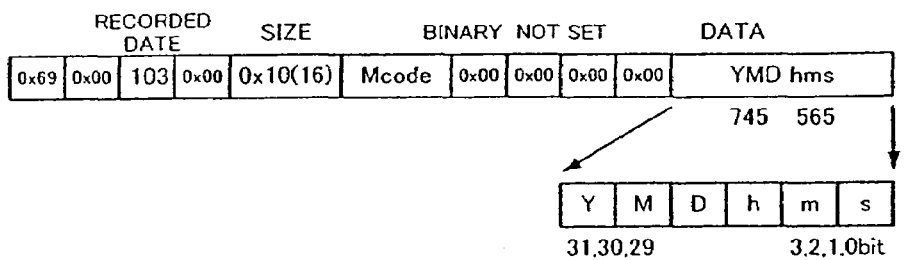
FIG. 16D depicts a data structure in accordance with the present invention wherein the additional information data is date/time information.

In FIG. 16D, key code ID=103 which represents recorded date and time as additional information, SIZE=0x10 (16 bytes) which represents that the data length of the additional information is 16 bytes, and C=0x00 and L=0x00 which represent that characters and language have not been set. The variable length data is a four-byte code (32 bit) representing the recorded date and time (year, month, day, hour, minute, second).

Figure 16E:
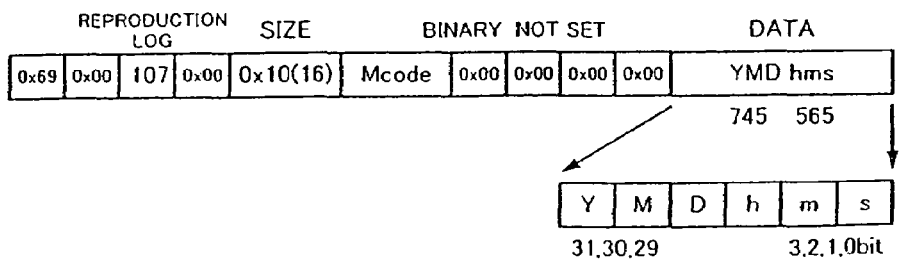
FIG. 16E depicts a data structure in accordance with the present invention wherein the additional information data is a reproduction log.

In FIG. 16E, key code ID=107 which represents a reproduction log as additional information, SIZE=0x10 (16 bytes) which represents that the data length of the additional information is 16 bytes, and C=0x00 and L=0x00 which represent that characters and language have not been set. The variable length data is a four-byte code representing a reproduction log (year, month, day, hour, minute, second). Illustratively, when recorder/player 1 has a reproduction log function, it records log data of 16 bytes whenever it reproduces music data.

FIG. 17 is a diagram showing the data arrangement of an ATRAC3 data file A3Dnnnn where 1 SU is N bytes (for example, N=384 bytes). FIG. 17 also shows an attribute header (1 block) of a data file and a music data file (1 block) along with the first byte (0x0000 to 0x7FFF) of each slot of the two blocks (16×2=32 kbytes). As shown in FIG. 18, the first 32 bytes of the attribute header are used as a header; 256 bytes are used as a music program area NM1 (256 bytes); and 512 bytes are used as a music program title area NM2 (512 bytes). The header of the ATRAC3 data file contains the following areas:
=BLKID-HD0 (4 bytes)
Meaning: BLOCKID FIELD ID
Function: Identifies the top of an ATRAC3 data file.
Value: Fixed value="HD=0" (For example, 0x48442D30)
=MCode (2 bytes)
Meaning: MAKER CODE
Function: Identifies the maker and model of the recorder/player 1
Value: High-order 10 bits (maker code); low-order 6 bits (machine code)
=BLOCK SERIAL (4 bytes)
Meaning: Track serial number
Function: Starts from 0 and increments by 1. Even if a music program is edited, this value does not vary.
Value: 0 to 0xFFFFFFFF.
=N1C+L (2 bytes)
Meaning: Represents the attribute of data (NM1) of a track (music program title).
Function: Represent the character code and language code of NM1 as one byte code.
Value: Same as SN1C+L
=N2C+L (2 bytes)
Meaning: Represents the attribute of data (NM2) of a track (music program title).

Function: Represent the character code and language code of NM1 as one byte code.
Value: Same as SN1C+L
=INFSIZE (2 bytes)
Meaning: Total size of additional information of current track.
Function: Represents the data size as a multiple of 16 bytes. When data is not recorded, this area should be all 0.
Value: 0x0000 to 0x3C6 (966)
=T-PRT (2 bytes)
Meaning: Number of total bytes
Function: Represents the number of parts that composes the current track. Normally, the value of T-PRT is 1.
Value: 1 to 285 (645 dec).
=T-SU (4 bytes)
Meaning: Number of total SU.
Function: Represents the total number of SU in one track that is equivalent to the program performance duration.
Value: 0x01 to 0x001FFFFF
=INX (2 bytes) (Optional)
Meaning: Relative position of INDEX
Function: Used as a pointer that represents the top of a representative portion of a music program. The value of INX is designated with a value of which the number of SU is divided by 4 as the current position of the program. This value of INX is equivalent to 4 times larger than the number of SU (around 93 msec).
Value: 0 to 0xFFFF (max, around 6084 sec)
=XT (2 bytes) (Optional)
Meaning: Reproduction duration of INDEX
Function: Designates the reproduction duration designated by INX-nnn with a value of which the number of SU is divided by 4. The value of INDEX is equivalent to four times larger than the normal SU (around 93 msec).
Value: 0x0000 (no setting); 0x01 to 0xFFFE (up to 6084 sec); 0xFFFF (up to end of music program)

Next, the music program title areas NM1 and NM2 are described.
=NM1
Means: Character string of music program title
Function: Represents a music program title as a one-byte code (up to 256 characters) (variable length). The title area should be completed with an end code (0x00). The size should be calculated from the end code. When data is not recorded, null (0x00) should be recorded from the beginning (0x0020) of the area for at least one byte.
Value: Various character codes
=NM2
Means: Character string of music program title
Function: Represents a music program title as two byte code (up to 512 characters) (variable length). The title area should be completed with an end code (0x00). The size should be calculated from the end code. When data is not recorded, null (0x100) should be recorded from the beginning (0x0120) of the area for at least two bytes.
Value: Various character codes Data of 80 bytes starting from the fixed position (0x320) of the attribute header is referred to as track information area TRKINF. This area is mainly used to totally manage the security information and copy control information of the particular track. FIG. 19 shows a part of TRKINF. The TRKINF area contains the following areas:
=CONTENTS KEY (8 bytes)
Meaning: Value for each music program. The value of CONTENTS KEY is protected in security block 52 of memory card 40 and then stored.
Function: Used as a key for reproducing a music program. It is used to calculate the value of MAC.
Value: 0 to 0xFFFFFFFFFFFFFFFF
=MAC (8 bytes)
Meaning: Forged copyright information check value.
Function: Represents the value generated with a plurality of values of TRKINF including contents cumulation numbers and a secret sequence number. The secret sequence number is a sequence number recorded in the secret area of memory card 40. A non-copyright protection type recorder cannot read data from a secret area of memory card 40. On the other hand, a copyright protection type recorder and a computer that operates with a program that can read data from a memory card can access the secret area.
=A (1 byte)
Meaning: Attribute of a part.
Function: Represents the information on such as compression mode of a part.
Value: See discussion hereinafter (see FIGS. 19 and 20).

Next, the value of area A is described. In the following description, monaural mode (N=0 or 1) is defined as a special joint mode in which bit 7=1, sub signal=0, and main signal= (L+R). A player without a copyright protection capability may ignore information bits 1 and 2.

Bit 0 of area A indicates whether emphasis is on or off. Bit 1 indicates skip reproduction or normal reproduction. Bit 2 designates the data type such as audio data, FAX data, or the like. Bit 3 is undefined. Mode information for ATRAC3 is represented as a combination of bits 4, 5, and 6, as shown in FIG. 20. In other words, N indicates mode and is represented with 3 bits. In FIG. 20, for the five types of modes listed (monaural (N=0 or 1), LP (N=2), SP (N=4), EX (N=5), and HQ (N=7)), record duration (64 MB memory card), data transmission rate, and the number of SU per block are provided. The number of bytes in each SU depends on the defined mode. In one monaural mode 1 SU has 136 bytes. In the LP mode 1 SU has 192 bytes. In the SP mode 1 SU has 304 bytes. In the EX mode 1 SU has 384 bytes. In the HQ mode 1 SU has 512 bytes. Bit 7 of area A represents ATRAC3type modes (0: Dual, 1: Joint).

As an example, a 64 MB memory card used in the SP mode is described. A 64 MB memory card has 3968 blocks. In the SP mode, since 1 SU has 304 bytes, a block is comprised of 53 SUs. Hence, 1 SU is equivalent to (1024/44100) seconds. Thus, a 64 MB memory card stores (1024/44100)×53× (3968−10)=4863 seconds=81 minutes. The transmission rate is (44100/1024)×304×8=104737 bps.

Referring back to FIG. 19, the remainder of the areas of TRKINF will be described.
=LT (one byte)
Meaning: Reproduction restriction flag (bits 7 and 6) and security partition (bits 5 to 0).
Function: Represents a restriction of the current track.
Value: bit 7: 0=no restriction, 1=restriction
  bit 6: 0=not expired, 1=expired
  bits 5 to 0: security partition (reproduction prohibited other than 0)
=FNo (2 bytes)
Meaning: File number.
Function: Represents the initially recorded track number that designates the position of the MAC calculation value recorded in the secret area of memory card 40.
Value: 1 to 0x190 (400)
=MG(D) SERIAL-nnn (16 bytes)

Meaning: Represents the serial number of security IC 20 of the recorder/player 1.
Function: Unique value for each recorder/player.
Value: 0 to 0xFFFFFFFFFFFFFFFFFFFFFFFFFFFFFFFF
=CONNUM (4 bytes)
Meaning: Contents cumulation number.
Function: Represents a unique value cumulated for each music program. The value is managed by security IC 20 of recorder/player 1. The upper limit of the value is 232 that is 4,200,000,000. Used to identify a recorded program.
Value: 0 to 0xFFFFFFFF
=YMDhms-S (4 bytes) (Optional)
Meaning: Reproduction start date and time of track with reproduction restriction.
Function: Represents the date and time at which data reproduction is permitted with EMD.
Value: Same as the notation of date and time of other areas.
=YMDhms-E (4 bytes) (Optional)
Meaning: Reproduction end date and time of track with reproduction restriction.
Function: Represents the date and time at which data reproduction is expired with EMD.
Value: Same as the notation of date and time of other areas.
=MT (1 byte) (Optional)
Meaning: Maximum value of number of permitted reproduction times.
Function: Represents the maximum number of reproduction times designated by EMD.
Value: 1 to 0xFF. When not used, the value of the area MT is 00.
=CT (1 byte) (Optional)
Meaning: Number of reproduction times.
Function: Represents the number of remaining permitted reproduction times. Whenever data is reproduced, the value of the area CT is decremented.
Value: 0x00 to 0xFF. When not used, the value of the area. CT is 0x00. When bit 7 of the area LT is 1 and the value of the area CT is 00, data is prohibited from being reproduced.
=CC (1 byte)
Meaning: COPY CONTROL
Function: Controls the copy operation.
Value: (see FIG. 21) bits 6 and 7 represent copy control information, bits 4 and 5 represent copy control information of a high speed digital copy operation, bits 2 and 3 represent a security block authentication level, and bits 0 and 1 are undefined.
Example of CC:
(bits 7 and 6)
11: Unlimited copy operation permitted
01: copy prohibited
00: one time copy operation permitted
(bits 3 and 2)
00: analog/digital input recording
MG authentication level is 0. When digital record operation using data from a CD is performed, (bits 7 and 6): 00 and (bits 3 and 2): 00.
=CN (1 byte) (Optional)
Meaning: Number of permitted copy times in high speed serial copy management system.
Function: Extends the copy permission with the number of copy times, not limited to one time copy permission and copy free permission. Valid only in first copy generation.

The value of the area CN is decremented whenever the copy operation is performed.
Value:
00: Copy prohibited
01 to 0xFE: Number of times
0xFF: Unlimited copy times
Referring once again to FIG. 17, the track information area TRKINF is followed by a 24-byte part management information area (PRTINF) starting at 0x0370. When a track is composed of a plurality of parts, the addresses of the individual parts are successively arranged in PRTINF. FIG. 22 shows a portion of the PRTINF area. Next, the PRTINF area is described in order of arrangement.
=PRTSIZE (4 bytes)
Meaning: Part size
Function: Represents the size of a part. Cluster: 2 bytes (highest position), start SU: 1 byte (upper), end SU: 1 byte (lowest position).
Value: cluster: 1 to 0x1F40 (8000)
start SU: 0 to 0xA0 (160)
end SU: 0 to 0xA0 (16) (Note that SU starts from 0.)
=PRTKEY (8 bytes)
Meaning: Part encrypting value
Function: Encrypts a part. Initial value=0. Note that edit rules should be applied.
Value: 0 to 0xFFFFFFFFFFFFFFFF
CONNUM0(4 bytes)
Meaning: Initially generated contents cumulation number key
Function: Uniquely designates an ID of contents.
Value: Same value as the value of the contents cumulation number initial value key
As is next shown in FIG. 17, the attribute header of an ATRAC3data file contains an additional information INF area. The additional information is the same as the additional information INF-S area (see FIGS. 11 and 12B) of the reproduction management file except that the start position is not fixed. The last byte position (a multiple of four bytes) at the end of one or a plurality of parts is followed by the additional information INF area.
=INF
Meaning: Additional information of a track.
Function: Represents variable length additional information with a header. A plurality of different types of additional information may be arranged. Each of additional information areas has an ID and a data size. Each additional information area is composed of at least 16 bytes and a multiple of 4 bytes.
Value: Same as additional information INF-S of reproduction management file
The above-described attribute header is followed by a plurality of data blocks. To each data block a header is added. Next, each block of the added header as shown in FIG. 23 is described.
=BLKID-A3D (4 bytes)
Meaning: BLOCK ID FILE ID
Function: Identifies the top of ATRAC3data.
Value: Fixed value="A3D" (for example, 0x41334420)
=MCode (2 bytes)
Meaning: MAKER CODE
Function: Identifies the maker and model of recorder/player 1.
Value: High-order 10 bits (maker code); low-order 6 bits (model code)
=CONNUMO (4 bytes)

Meaning: Cumulated number of initially created contents.
Function: Designates a unique ID for contents. Even if the contents are edited, the value of the area CONNUM0 is not changed.
Value: Same as the contents cumulation number initial key.
=BLOCK SERIAL (4 bytes)
Meaning: Serial number assigned to each track.
Function: Starts from 0 and increments by 1. Even if the contents are edited, the value of the area BLOCK SERIAL is not changed.
Value: 0 to 0xFFFFFFFF
=BLOCK-SEED (8 bytes)
Meaning: Key for encrypting one block.
Function: The beginning of the block is a random number generated by security IC 20 of recorder/player 1. The random number is followed by a value incremented by 1. When the value of the area BLOCK-SEED is lost, since sound is not generated for approximately one second or equivalent to one block, the same data is written to the header and the end of the block. Even if the contents are edited, the value of the area BLOCK-SEED is not changed.
Value: Initially 8-bit random number.
=INITIALIZATION VECTOR (8 bytes)
Meaning: Value used for encrypting/decrypting ATRAC3data.
Function: Represents an initial value used for encrypting and decrypting ATRAC3data for each block. A block starts from 0. The next block starts from the last encrypted 8-bit value at the last SU. When a block is divided, the last eight bytes just before the start SU is used. Even if the contents are edited, the value of the area INITIALIZATION VECTOR is not changed.
Value: 0 to 0xFFFFFFFFFFFFFFFF
=SU-nnn
Meaning: Data of sound unit.
Function: Represents data compressed from 1024 samples. The number of bytes of data depends on the compression mode. Even if the contents are edited, the value of the area SU-nnn is not changed. For example, in the SP mode, N=384 bytes.
Value: Data value of ATRAC3

In FIG. 17, since N=384, 42 SUs are written to one block. The first two slots (4 bytes) of the block are used as a header. In the last slot (two bytes), BLKID-A3D, MCode, CONNUM0, and BLOCK SERIAL are redundantly written. Thus, M bytes of the remaining area of one block is (16,384−384× 42−16×3=208) bytes. As described above, the eight-byte area BLOCK SEED is also redundantly recorded.

Figure 24A:
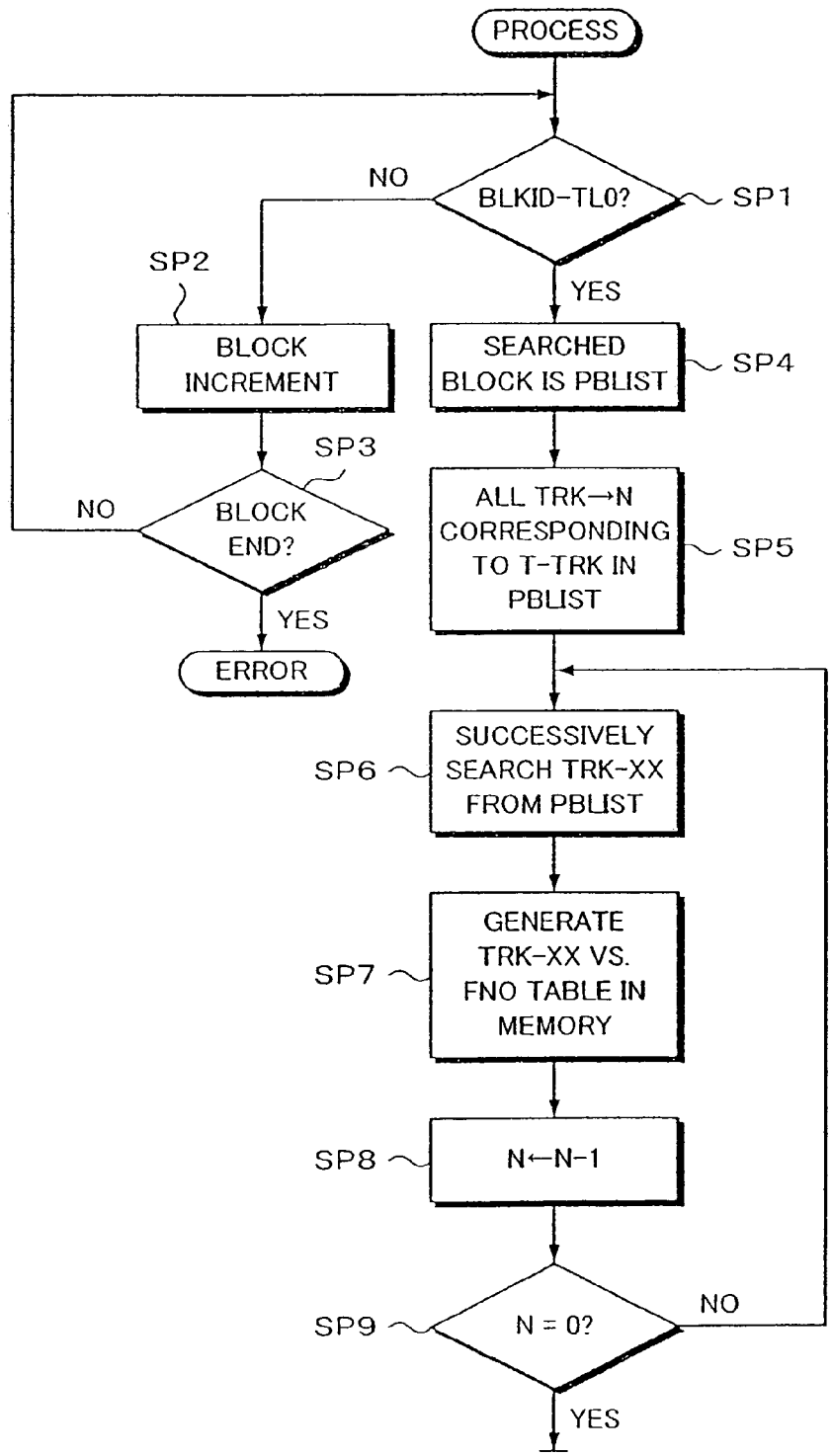
FIGS. 24A to 24C are flowcharts for a recovering method according to the present invention for the case wherein a FAT area was destroyed.
Figure 24B:
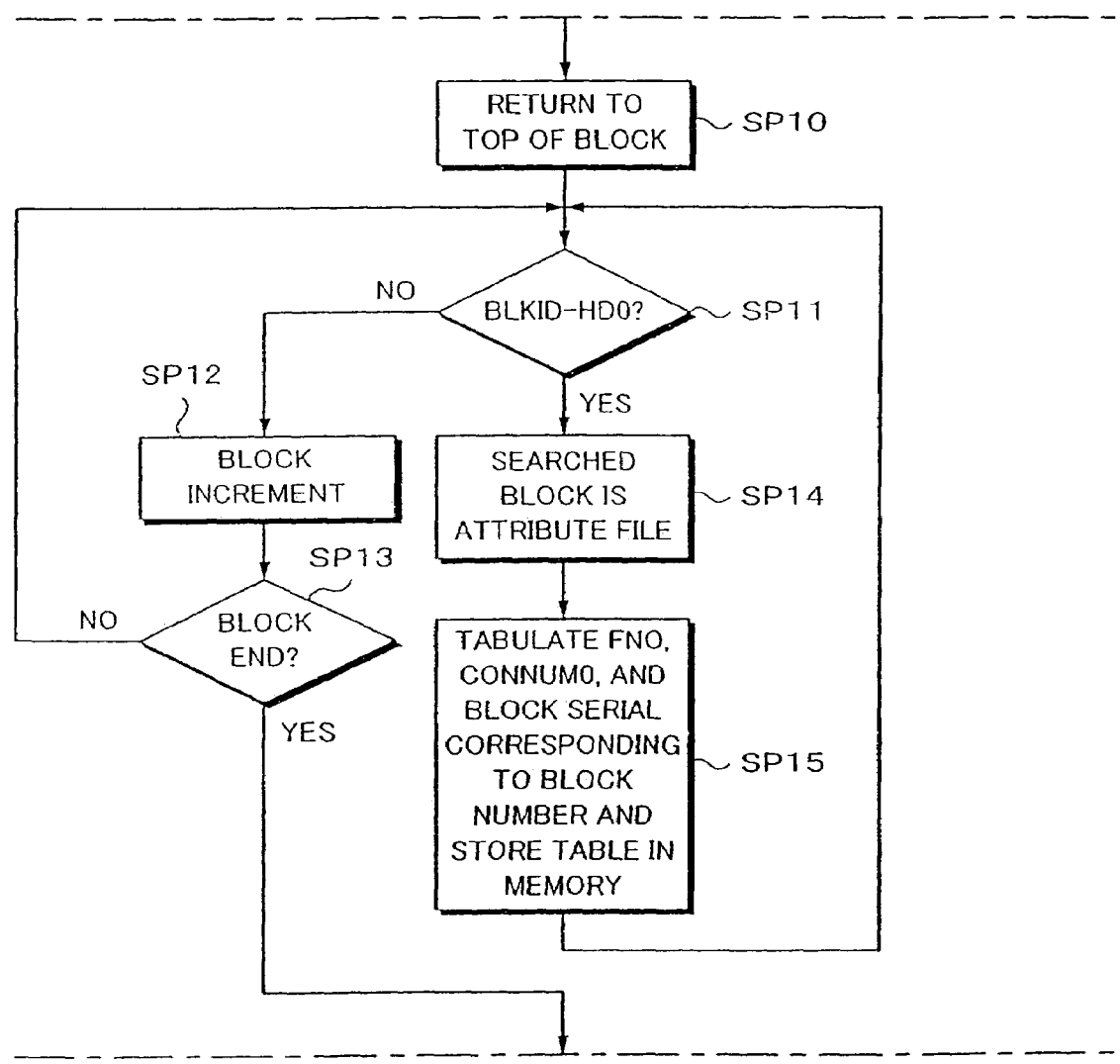
Figure 24C:
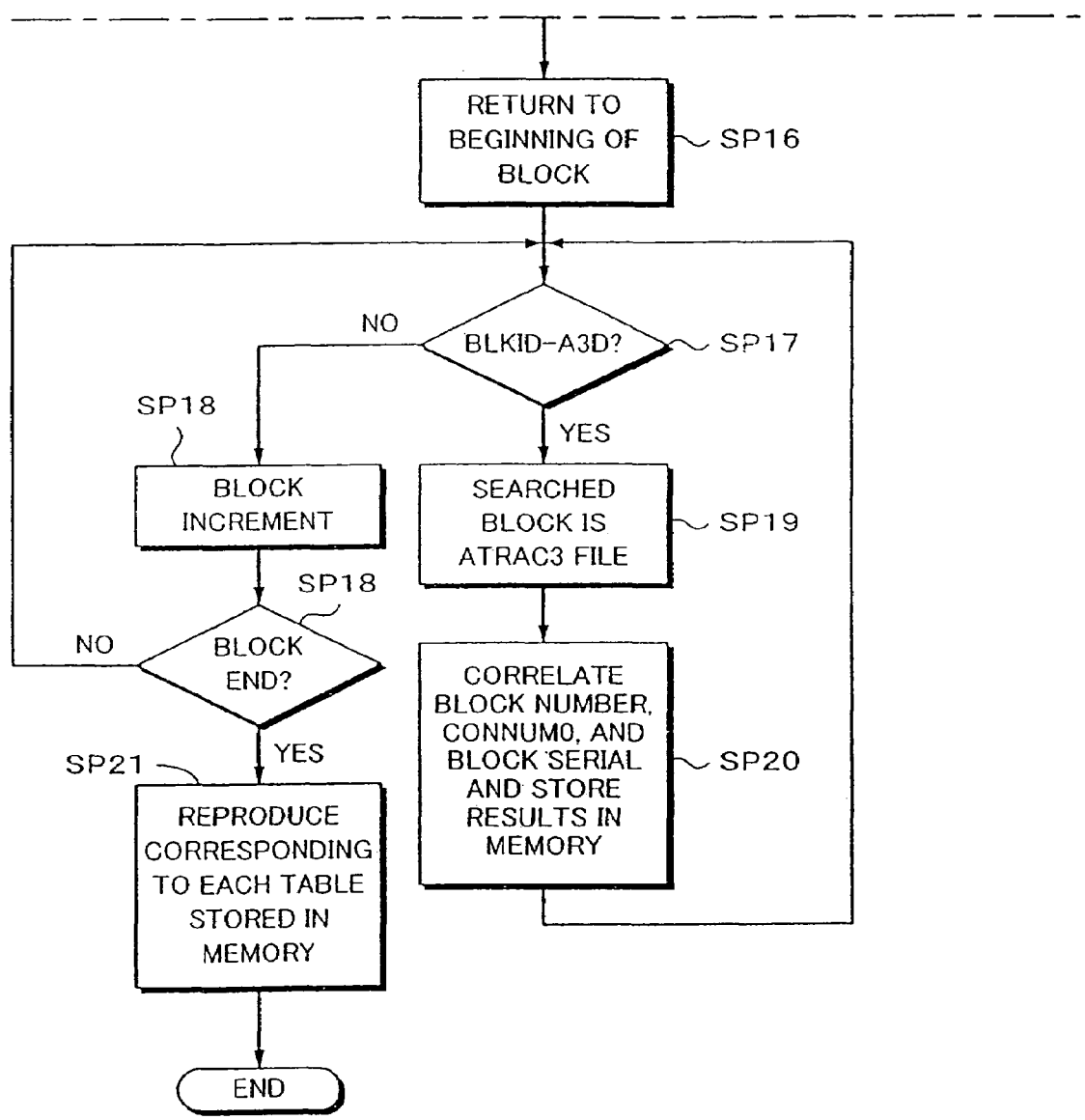

If the FAT area is destroyed, all blocks of flash memory 42 are searched. It is determined whether the value of the area ID BLKID at the beginning of each block is TL0, HD0, or A3D. As shown in FIGS. 24A to 24C, at step SP1, it is determined whether or not the value of the area ID BLKID at the beginning of the top block is BLKID-TL1. If the determined result at step SP1 is No, the flow advances to step SP2. At step SP2, the block number is incremented. Thereafter, at step SP3, it is determined whether or not the last block has been searched.

If the determined result at step SP3 is No, the flow returns to step SP1. If the determined result is Yes, If the determined result at step SP1 is Yes, the flow advances to step SP4. At step SP4, the searched block is the reproduction management file PBLIST. Thereafter, the flow advances to step SP5. At step SP5, the number of total tracks T-TRK in the reproduction management file PBLIST is stored as N to the register. For example, if 10 ATRAC3 data files (10 music programs) are stored in memory 42, then 10 is stored in T-TRK.

Next, at step SP6, with reference to the value of the number of total tracks T-TRK, TRK-001 to TRK-400 of blocks are successively referenced. In this example, since 10 music programs have been recorded, TRK-001 to TRK-010 of blocks are referenced. At step SP7, since a file number FNO has been recorded in TRK-XXX (where X=1 to 400), a table that correlates the track number TRK-XXX and the file number FNO is stored to memory 42. Next, at step SP8, N stored in the register is decremented. A loop of steps SP6, SP7, and SP8 is repeated until N becomes 0 at step SP9.

If the determined result at step SP9 is Yes, the flow advances to step SP10. At step SP10, a pointer is reset to the top block. The searching process is repeated from the top block. Thereafter, the flow advances to step SP11. At step SP11, it is determined whether or not the value of the area ID BLKID of the top block is BLKID-HD0. If the determined result at step SP11 is No, the flow advances to step SP12. At step SP12, the block number is incremented. At step SP13, it is determined whether or not the last block has been searched.

If the determined result at step SP13 is No, the flow returns to step SP11. The searching process is repeated until the determined result at step SP11 becomes Yes.

If the determined result at step SP11 is Yes, the flow advances to step SP14. At step SP14, it is determined that the block is the attribute header (see FIG. 9) (0x0000 to 0x03FFF shown in FIG. 18) at the beginning of the ATRAC3data file.

Next, at step SP15, the file number FNO, the sequence number BLOCK SERIAL of the same ATRAC data file, and the contents cumulation number key CONNUM0contained in the attribute header are stored to memory 42. If 10 ATRAC3data files have been recorded, since there are 10 blocks of which the value of the area ID BLKID is BLKID-TL0, the searching process is continued until 10 blocks are searched.

If the determined result at step SP13 is Yes, the flow advances to step SP16. At step SP16, the pointer is reset to the top block. The searching process is repeated from the top block.

Thereafter, the flow advances to step SP17. At step SP17, it is determined whether or not the value of the area ID BLKID of the top block is BLKID-A3D.

If the determined result at step SP17 is No, the flow advances to step SP18. At step SP18, the block number is incremented. Thereafter, at step SP18', it is determined whether or not the last block has been searched. When the determined result at step SP18' is No, the flow returns to step SP17.

If the determined result at step SP17 is Yes, the flow advances to step SP19. At step SP19, it is determined that the block contains ATRAC3data. Thereafter, the flow advances to step SP20. At step SP20, the current block number is correlated with the serial number BLOCK SERIAL recorded in the ATRAC3data block and the contents cumulation number key CONNUM0, and the results thereof are stored to memory 42.

In the same ATRAC3 data file, the common number is assigned as the contents cumulation number key CONNUM0. In other words, if one ATRAC3data file is composed of 10 blocks, a common number is assigned to all the values of the CONNUM0areas.

In addition, if one ATRAC3data file is composed of 10 blocks, serial numbers 1 to 0 are assigned to the values of the BLOCK SERIAL areas of the 10 blocks.

Corresponding to the values of the CONNUM0and BLOCK SERIAL areas, it is determined whether the current block composes the same contents and reproduction order for the same contents in the current block (namely, the connection sequence).

If 10 ATRAC3data files (namely, 10 music programs) are recorded and each of the ATRAC3data files is composed of 10 blocks, there are 100 data blocks.

With reference to the values of the CONNUM0 and BLOCK SERIAL areas, the reproduction order of music programs of 100 data blocks and the connection order thereof can be obtained.

If the determined result at step SP18' is Yes, all the blocks have been searched for the reproduction management file, the ATRAC3data file, and the attribute file. Thus, at step SP21, based on the values of the CONNUM0, BLOCK SERIAL, FNO, and TRK-X areas in the order of block numbers of the blocks stored in memory 42, the file connection state is obtained.

After the connection state is obtained, the FAT may be generated in a free area of memory 42.

Figure 25:
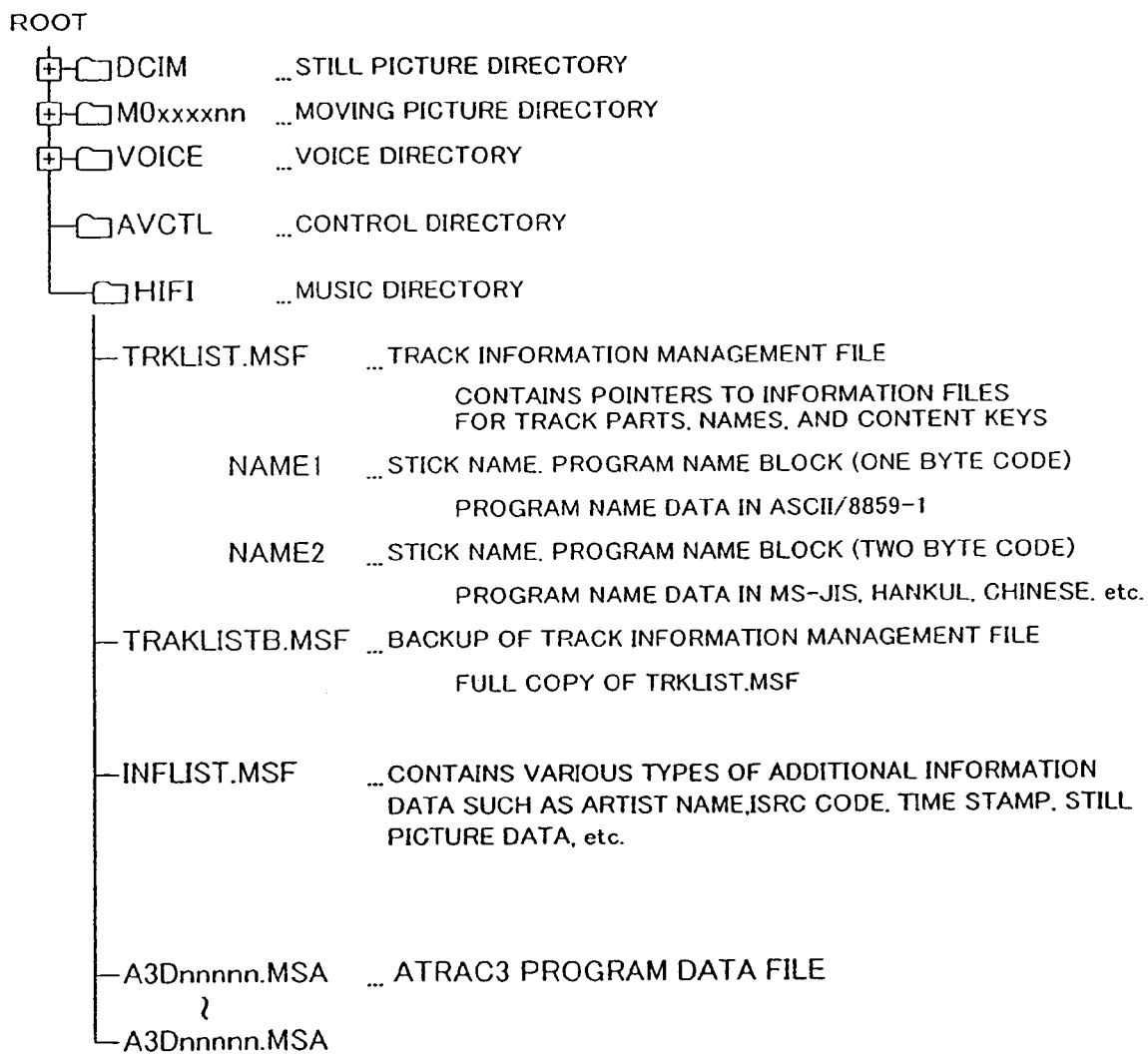
FIG. 25 depicts a file structure in a memory card according to an embodiment of the present invention.

Next, a management file according to another embodiment of the present invention will be described. FIG. 25 shows the file structure according to the second embodiment of the present invention. Referring to FIG. 25, a music directory contains a track information management file TRKLIST-.MSF (hereinafter, referred to as TRKLIST), a backup track information management file TRKLISTB.MSF (hereinafter, referred to as TRKLISTB), an additional information file INFLIST.MSF (that contains an artist name, an ISRC code, a time stamp, still picture data, and so forth (this file is referred to as INFLIST)), and an ATRAC3data file A3Dnnnn.MSA (hereinafter, referred to as A3nnnn). The file TRKLIST contains two areas NAME1 and NAME2. The area NAME1 contains the memory card name and the program name (for one byte code corresponding to ASCII/8859-1 character code). The area NAME2 contains the memory card name and the program name (for a two byte code corresponding to MS-JIS/Hankul/Chinese code).

Figure 26:
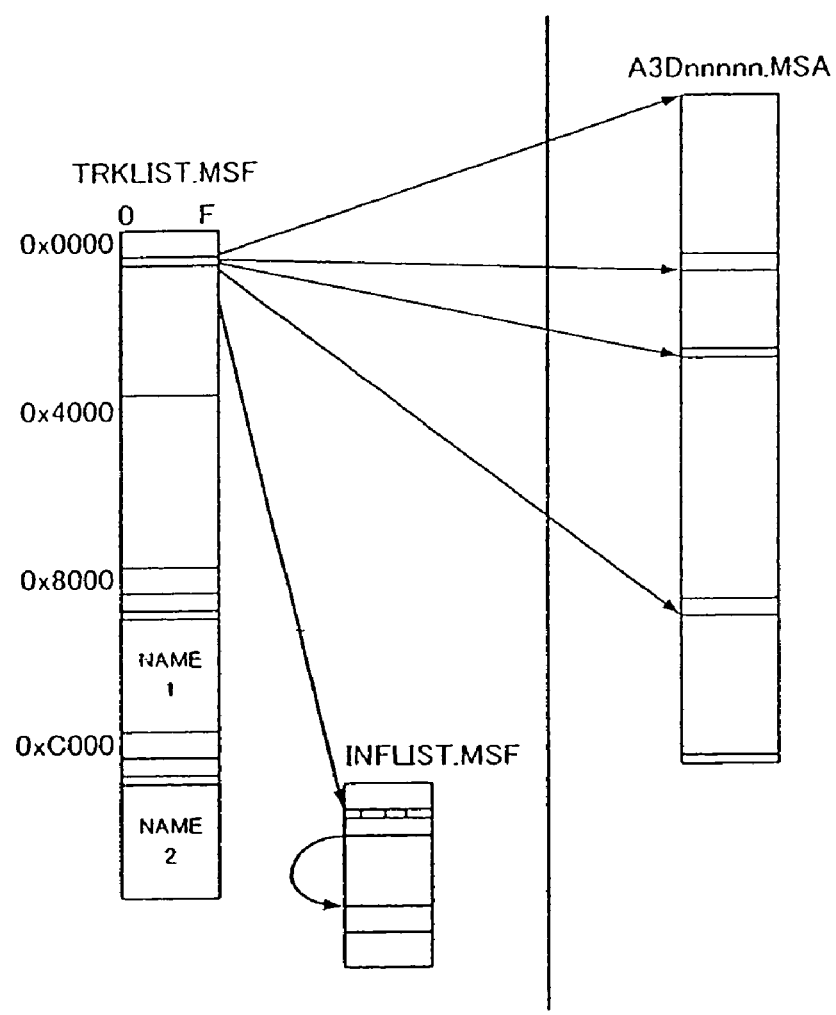
FIG. 26 illustrates the relationship between a track information management file TRKLIST.MSF and an ATRAC3 data file A3Dnnnnn.MSA according to an embodiment of the present invention.

FIG. 26 shows the relationship between the track information management file TRKLIST, the areas NAME1 and NAME2, and the ATRAC3data file A3Dnnnn. The file TRKLIST is a fixed-length file of 64 kbytes (=16 k×4). An area of 32 kbytes of the file is used for managing tracks. The remaining area of 32 kbytes is used to contain the areas NAME1 and NAME2. Although the areas NAME1 and NAME2 for program names may be provided as a separate file from the track information management file, in a system having a small storage capacity, it is convenient to manage the track information management file and program name files together.

The track information area TRKINF-nnnn and part information area PRTINF-nnnn of the track information management file TRKLIST are used to manage the data file A3Dnnnn and the additional information INFLIST. Only the ATRAC3data file A3Dnnnn is encrypted. In FIG. 26, the data length in the horizontal direction is 16 bytes (0 to F). A hexadecimal number in the vertical direction represents the value at the beginning of the current line.

According to this embodiment, three files: the track management file TRKLIST (including a program title file), the additional information management file INFLIST, and the data file A3Dnnnn are used. According to the previous embodiment described with reference to FIGS. 7, 8, and 9, two files: the reproduction management file PBLIST for managing memory card 40 and the data file ATRAC3 for storing programs are used.

Next, the data structure according to this embodiment will be described. For simplicity, in this data structure, the description of similar portions to those of the previous embodiment is omitted.

FIG. 27 shows the structure of the track information management file TRKLIST. In the track information management file TRKLIST, one cluster (block) is composed of 16 kbytes. The size and data of the file TRKLIST are the same as those of the backup file TRKLISTB. The first 32 bytes of the track information management file are used as a header. As with the header of the reproduction management file PBLIST, the header of the file TRKLIST contains a BLKID-TL0/TL1 (backup file ID) area (4 bytes), an area T-TRK (2 bytes) for the number of total tracks, a maker code area MCode (2 bytes), an area REVISION (4 bytes) for the number of TRKLIST rewrite times, and an area S-YMDhms (4 bytes) (Optional) for update date and time data. The meanings and functions of these data areas are the same as those of the previous embodiment. In addition, the file TRKLIST contains the following areas:

=YMDhms (4 bytes)

Represents the last update date (year, month, day) of the file TRKLIST.

=N1(1 byte) (Optional)

Represents the sequential number of memory card 40 (numerator side). When one memory card is used, the value of the area N1 is 0x01.

=N2(1 byte) (Optional)

Represents the sequential number of memory card 40 (denominator side). When one memory card is used, the value of the area N2 is 0x01.

=MSID (2 bytes) (Optional)

Represents the ID of memory card 40. When a plurality of memory cards is used, the value of the area MSID of each memory card is the same (T.B.D.). (T.B.D. (to be defined) represents that this value may be defined in future).

=S-TRK (2 bytes).

Represents a special track (T.B.D.). Normally, the value of the area S-TRK is 0x0000.

=PASS (2 bytes) (Optional)

Represents a password (T.B.D.).

=APP (2 bytes) (Optional)

Represents the definition of a reproduction application (T.B.D.) (normally, the value of the area APP is 0x0000).

=INF-S (2 bytes) (Optional)

Represents the additional information pointer of the entire memory card 40. When there is no additional information, the value of the area INF-S is 0x00.

The last 16 bytes of the file TRKLIST are used for an area BLKID-TL0, an area MCode, and an area REVISION that are the same as those of the header. The backup file TRKLISTB contains the above-described header. In this case, the header contains an area BLKID-TL1, an area MCode, and an area REVISION.

The header is followed by a track information area TRKINF which may have information with respect to each track and a part information area PRTINF which may have information with respect to each part of the tracks (music programs). FIG. 27 shows the areas preceded by the area TRKLIST. The lower portion of the area TRKLISTB shows the structure of these areas. In FIG. 27, a shaded area represents an unused area.

The track information area TRKINF-nnn and the part information area PRTINF-nnn contain areas of an ATRAC3data file. In other words, the track information area TRKINF-nnn and the part information area PRTINF-nnn each contain a reproduction restriction flag area LT (1 byte), a contents key area CONTENTS KEY (8 bytes), a recorder/player security IC serial number area MG(D) SERIAL (16 bytes), an area XT (2 bytes) (Optional) for representing a feature portion of a music program, an area INX (2 bytes) (Optional), an area YMDhms-S (4 bytes) (Optional), an area YMDhms-E (4 bytes) (Optional), an area MT (1 byte) (Optional), an area CT (1 byte) (Optional), an area CC (1 byte) (Optional), an area CN (1 byte) (Optional) (areas YMDhms-S, YMDhms-E, MT, CT, CC, and CN are used for reproduction restriction information and copy control information), an area A (1 byte) for part attribute, a part size area PRTSIZE (4 bytes), a part key area PRTKEY (8 bytes), and a contents cumulation number area CONNUM (4 bytes). The meanings, functions, and values of these areas may be the same as those of the previous embodiment. In addition, the track information area TRKINF-nnn and the part information area PRTINF-nnn each contain the following areas:

=T0 (1 byte)

Fixed value (T0=0x74)

=INF-nnn (Optional) (2 bytes)

Represents the additional information pointer (0 to 409) of each track. 00: music program without additional information.

=FNM-nnn (4 bytes)

Represents the file number (0x0000 to 0xFFFF) of an ATRAC3data file.

The number nnnn (in ASCII) of the ATRAC3data file name (A3Dnnnn) is converted into 0xnnnnnn.

=APP_CTL (4 bytes) (Optional)

Represents an application parameter (T.B.D.). (Normally, the value of the area APP_CTL is 0x0000).

=P-nnn (2 bytes)

Represents the number of parts (1 to 2039) that compose a music program. This area corresponds to the above-described area T-PART.

=PR (1 byte)

Fixed value (PR=0x50).

Next, the areas NAME1 (for one byte code) and NAME2 (for two byte code) for managing names will be described. FIG. 28 shows the structure of the area NAME1 (for one byte code area). Each of the areas NAME1 and NAME2 (which will be described later) is segmented into eight byte slots. At 0x8000, which is the beginning of each of these areas, a header is placed. The header is followed by a pointer and a name. The last slot of the area NAME1 contains the same areas as the header.

=BLKID-NM1 (4 bytes)

Represents the contents of a block (fixed value) (NM1=0x4E4D2D31).

=PNM1-S

Represents the pointer to a name representing a memory card.

nnn (=1 to 408) represents the pointer to a music program title.

The pointer represents the start position (2 bytes) of the block, the character code type (2 bits), and the data size (14 bits).

=PNM-nnn (4 bytes) (Optional)

Represents the pointer to the area NM1 (for one byte code).

=NM1-nnn (Optional)

Represents memory card name and music program title in a one byte code (variable length). An end code (0x00) is written at the end of the area.

FIG. 29 shows the data structure of the area NAME2 (for two byte code). At 0xC000, which is the beginning of the area, a header is placed. The header is followed by a pointer and a name. The last slot of the area NAME2 contains the same areas as the header.

=BLKID-NM2 (4 bytes)

Represents the contents of a block (fixed value) (NM2=0x4E4D2D32).

PNM2-nnn (4 bytes) (Optional)

Represents the pointer to the area NM2 (for two byte code).

PNM2-S represents the pointer to a name representing memory card 40. nnn (=1 to 408) represents the pointer to a music program title.

The pointer represents the start position (2 bytes) of the block, the character code type (2 bits), and the data size (14 bits).

=NM2-nnn (Optional)

Represents memory card name and music program title in a two byte code (variable). An end code (0x0000) is written at the end of the area.

FIG. 30 shows the data arrangement (for one block) of the ATRAC3 data file A3Dnnnn in the case that 1 SU is composed of N bytes. In this file, one slot is composed of eight bytes. FIG. 30 shows the values of the top portion (0x0000 to 0x3FF8) of each slot. The first four slots of the file are used for a header. The header contains an area BLKID-A3D (4 bytes), a maker code area MCode (2 bytes), an area BLOCK SEED (8 bytes) used for the encrypting process, an area CONNUM0 (4 bytes) for the initial contents cumulation number, a serial number area BLOCK SERIAL (4 bytes) for each track, and an area INITIALIZATION VECTOR (8 bytes) used for the encrypting/decrypting process. The penultimate slot of the block redundantly contains an area BLOCK SEED. The last slot contains areas BLKID-A3D and MCode. The header is followed by the sound unit data SU-nnnn.

FIG. 31 shows the data structure of the additional information management file INFLIST that contains additional information. At the beginning (0x0000) of the file INFLIST, a header comprising the following is placed. The header is followed by the subsequently described pointer and areas.

=BLKID-INF (4 bytes)

Represents the contents of the block (fixed value) (INF=0x494E464F).

=T-DAT (2 blocks)

Represents the number of total data areas (0 to 409).

MCode (2 bytes)

Represents the maker code of recorder/player 1.

=YMDhms (4 bytes)

Represents the record updated date and time.

=INF-nnnn (4 bytes)

Represents the pointer to the area DATA of the additional information (variable length, as 2 bytes (slot) at a time). The start position is represented with the high order 16 bits (0000 to FFFF).

=DataSlot-0000 (0x0800)

Represents the offset value from the beginning (in increments of a slot).

The data size is represented with low order 16 bits (0001 to 7FFF). A disable flag is set at the most significant bit. MSB=0 (Enable), MSB=1 (Disable)

The data size represents the total data amount of the music program.

(The data starts from the beginning of each slot. The non-data area of the slot is filled with 00.)

The first INF represents a pointer to additional information of the entire album (normally, INF409).

FIG. 32 shows the structure of additional-information. An 8-byte header is placed at the beginning of one additional information data area. The structure of the additional information is the same as that described with reference to FIG. 12C. In other words, the additional information contains an area IN (2 bytes) as an ID, an area key code ID (1 byte), an area SIZE (2 bytes) that represents the size of each additional information area, and a maker code area MCode (2 bytes). In addition, the additional information contains an area SID (1 byte) as a sub ID.

Figure 33:
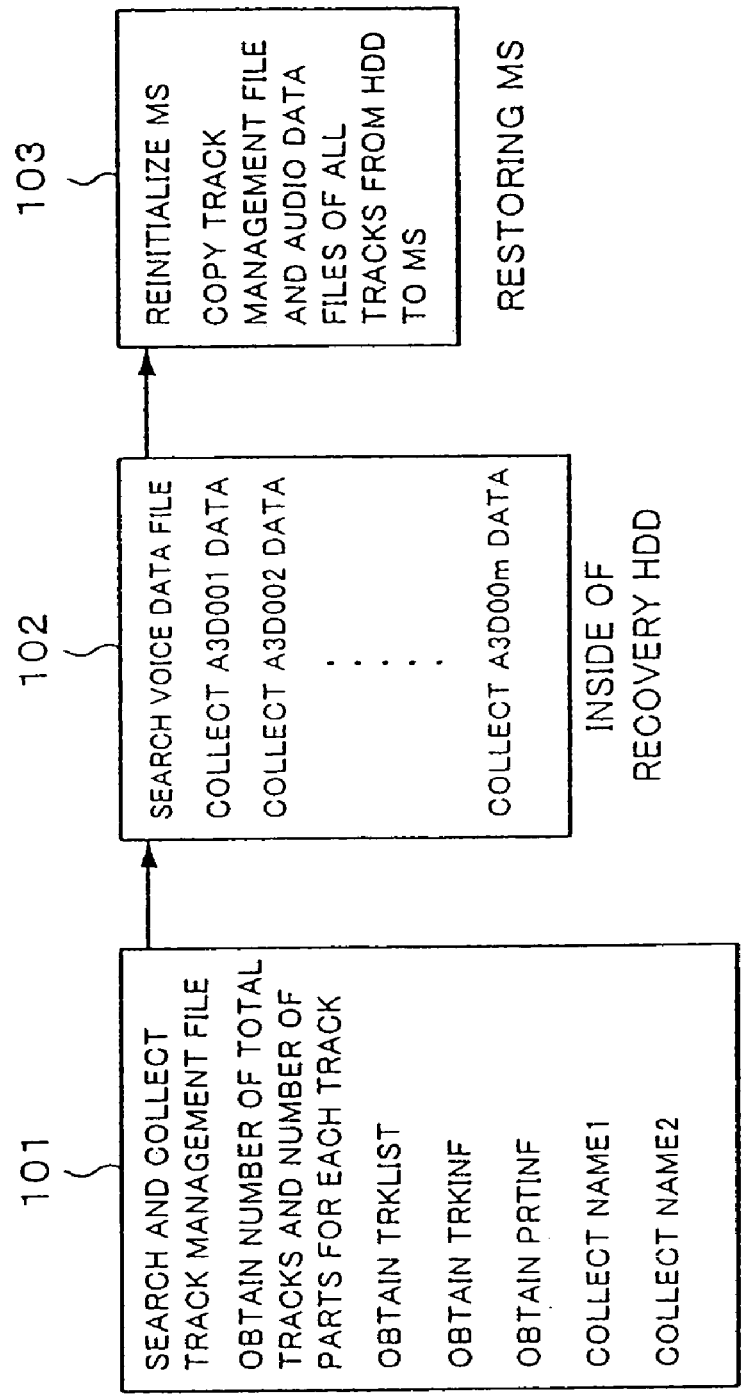
FIG. 33 is a flowchart for a recovering method according to an embodiment of the present invention for the case wherein a FAT area was destroyed.

According to this embodiment of the present invention, in addition to the file system defined as a format of memory card 40, the track information management file TRKLIST for music data is used. Thus, even if the FAT is destroyed, a file can be recovered. FIG. 33 shows a flow of a file recovering process. To recover a file, a computer that operates with a file recovery program and that can access memory card 40 and a storing device (hard disk, RAM, or the like) connected to the computer are used. The computer has a function equivalent to DSP 30. Next, a file recovering process using the track management file TRKLIST will be described.

All blocks of flash memory 42 whose FAT has been destroyed are searched for TL-0 as the value (BLKID) at the top position of each block. In addition, all of the blocks are searched for NM-1 as the value (BLKID) at the top position of each block. Thereafter, all of the blocks are searched for NM-2 as the value (BLKID) at the top position of each block. The contents of the four blocks (track information management file) are stored to, for example, a hard disk by the recovery computer.

The number of total tracks is obtained from data after the fourth byte of the track information management file. The 20-th byte of the track information area TRKINF-001, the value of the area CONNUM-001 of the first music program, and the value of the next area P-001 are obtained. The number of parts is obtained with the value of the area P-001. The values of the areas PRTSIZE of all parts of track 1 of the area PRTINF are obtained. The number of total blocks (clusters) n is calculated and obtained.

After the track information management file is obtained, the flow advances to step 102. At step 102, a voice data file (ATRAC3data file) is searched. All blocks other than the management file is searched from flash memory 42. Blocks whose top value (BLKID) is A3D are collected.

A block with the value of the area CONNUM0at the 16-th byte of A3Dnnnn being the same as that of the area CONNUM-001 of the first music program of the track information management file, and with the value of the area BLOCK SERIAL starting from the 20-th byte being 0 is searched. After the first block is obtained, a block (cluster) with the same value for the area CONNUM as the first block and of which the value of BLOCK SERIAL is incremented by 1 (1=0+1) is searched. After the second block is obtained, a block with the same value for the area CONNUM0as the second block and of which the value of the area BLOCK SERIAL is incremented by 1 (2=1+1) is searched.

By repeating the process, the ATRAC3data file is searched until n blocks (clusters) of track 1 are obtained. When all the blocks (clusters) are obtained, they are successively stored to the hard disk.

The same process for track 1 is performed for track 2. In other words, a block with the value of the area CONNUM0being the same as that of the area CONNUM-002 of the first music program of the track information management file, and with the value of the area BLOCK SERIAL starting at the 20-th byte being 0 is searched. Thereafter, in the same manner as track 1, the ATRAC3data file is searched until the last block (cluster) n' is detected. After all blocks (clusters) are obtained, they are successively stored to the hard disk.

By repeating the above-described process for all tracks (the number of tracks: m), all of the ATRAC3data is stored to the hard disk controlled by the recovering computer.

At step 103, memory card 40 whose FAT has been destroyed is re-initialized and then the FAT is reconstructed. A predetermined directory is formed in memory card 40. Thereafter, the track information management file and the ATRAC3data file for m tracks are copied from the hard disk to memory card 40. Thus, the recovery process is finished.

In the management file and data file, important parameters (in particular, codes in headers) may be recorded in triplicate instead of duplicate. When data is redundantly recorded, sets of the same data may be recorded at any position as long as they are at least one page apart from one another.

Next, the file (music program) combine process and divide process using the file management method according to the embodiment of FIGS. 4 to 24 will be described.

Combine Process

Combine Process on FAT

In the combine process on the FAT, two files CAT.MSA and MAN.MSA of three files (music programs) CAT.MSA, DOG.MSA, and MAN.MSA are combined.

Figure 34:
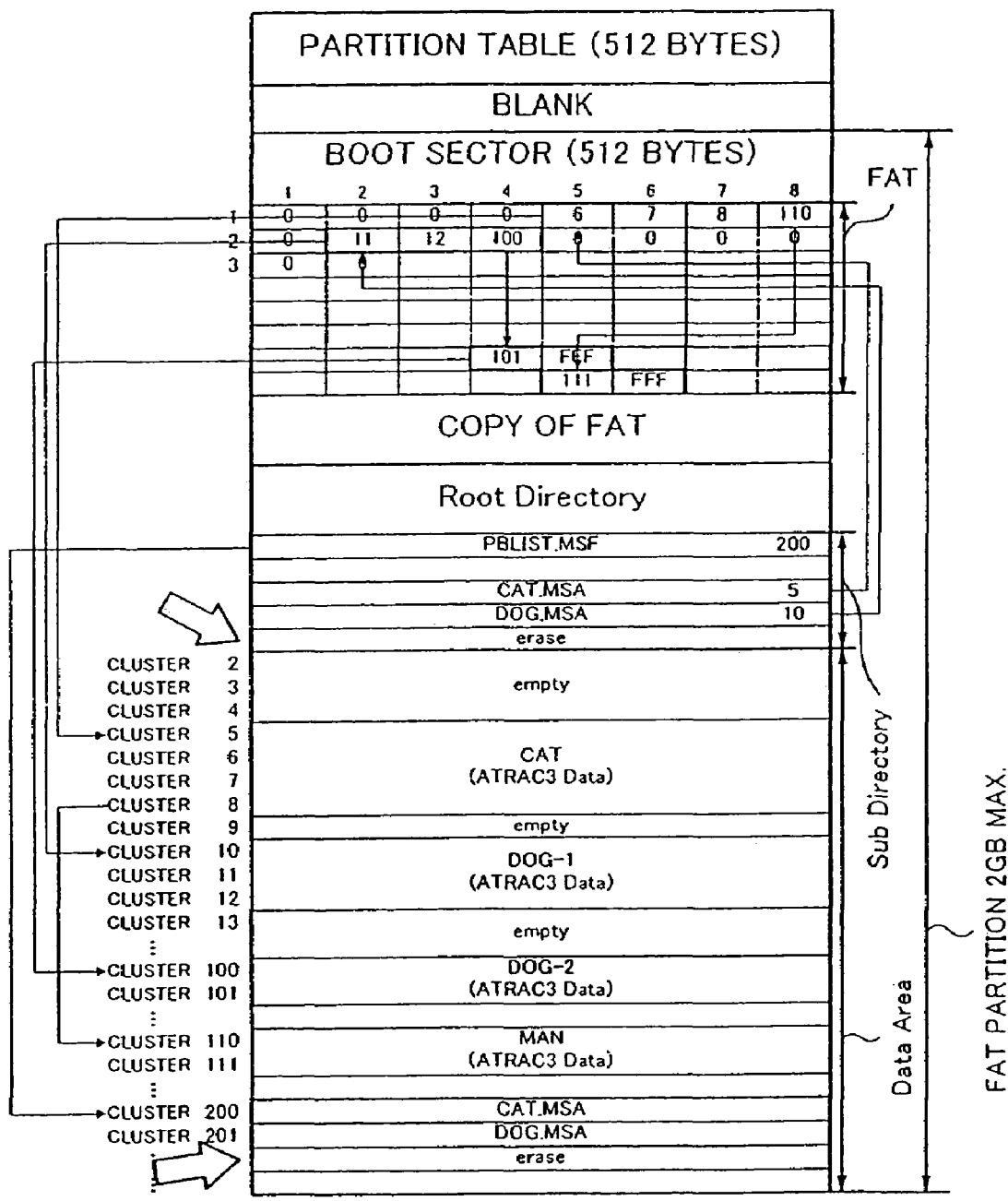
FIG. 34 depicts a memory map for explaining data transitions in a combine process for combining particular files in the memory map structure (see FIG. 6) according to an embodiment of the present invention.

As shown in FIG. 34, when a user combines the two files into one file, the entry address at the end of the cluster management data on the FAT corresponding to the file CAT.MSA is changed from "FFF" to the start address "110" on the FAT corresponding to the file MAN.MSA (see also FIG. 6).

Thus, the combined file CAT.MSA uses the clusters 5, 6, 7, 8, 110, and 111. In addition, the file name MAN.MSA is deleted from the sub directory area. Moreover, the file name MAN.MSA managed with the cluster 202 is deleted.

Editing Attribute Header

The editing method on the FAT for combining the two files CAT.MSA and MAN.MSA was described in the preceding section. Next, with reference to FIGS. 35A and 35B, the editing method of attribute headers of the reproduction management file PBLIST.MSF shown in FIG. 11 and the ATRAC3data file shown in FIG. 17 will be described.

Figure 35B:
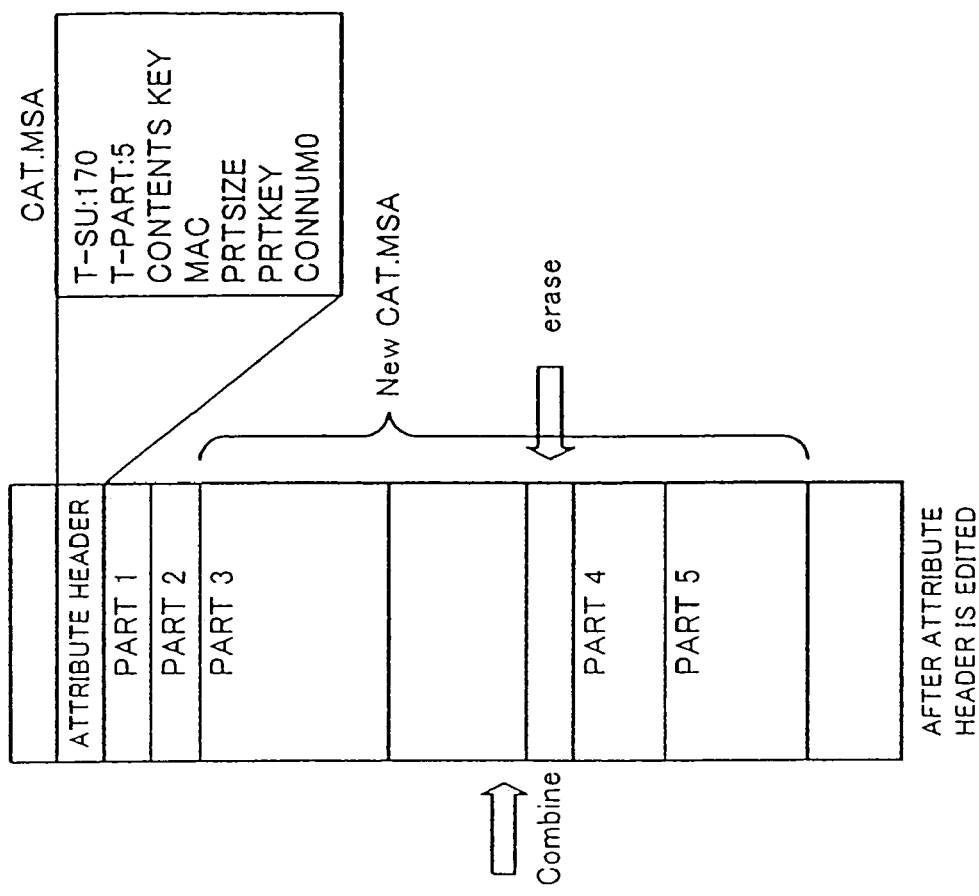
FIG. 35B depicts a memory map after two files are combined in accordance with the present invention.
Figure 35A:
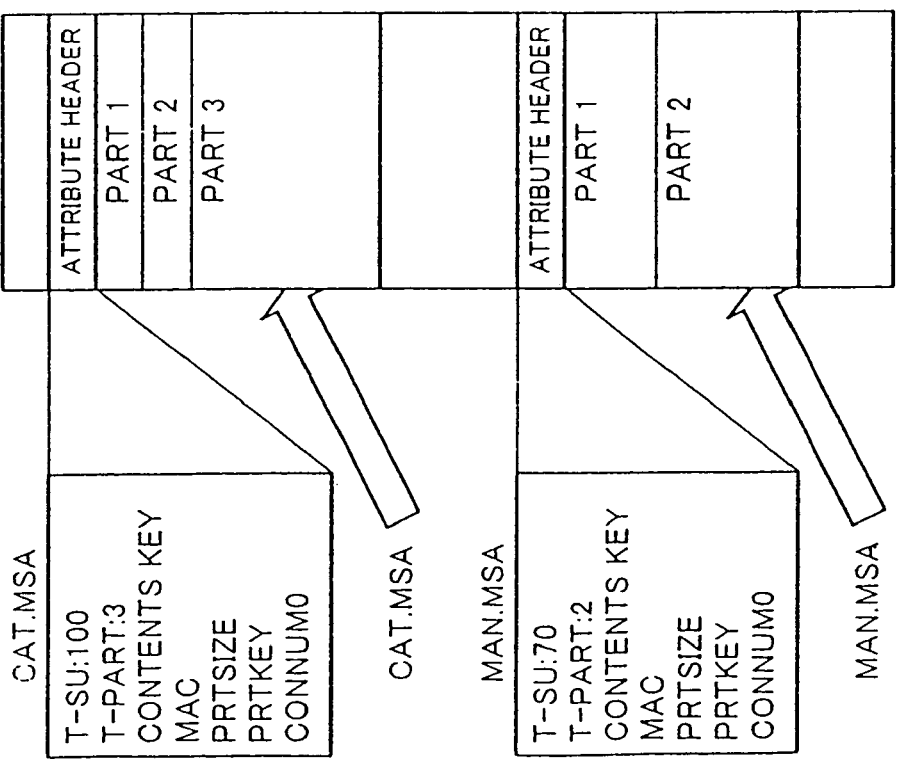
FIG. 35A depicts a memory map before two files are combined in accordance with the present invention.

FIG. 35A is a diagram showing a memory map of the two files CAT.MSA and MAN.MSA that have not been edited.

The memory map shown in FIG. 35A is in a state where logical addresses have been converted into physical addresses. In addition, although parts are dispersed in memory 42, for simplicity, they are successively arranged. As shown in FIG. 35A, the attribute file of the file CAT.MSA contains the number of the total sound units T-SU:100, the number of total parts T-PRT:3, a contents key, a MAC, a part size and a part key for each part, and a contents cumulation number CONNUM0.

Likewise, the attribute file of the file MAN.MSA contains the number of total sound units T-SU:70, the number of total parts T-PRT:2, a contents key, a MAC, a part size and a part key for each part, and a contents cumulation number CONNUM0.

The data of the attribute file of the file CAT.MSA is updated as follows.

When music programs are combined, the number of parts of a single file increases. Thus, the T-PRT contained in the attribute file is edited. In addition, since files are combined, the number of total sound units increases. Thus, the T-SU is edited.

In other words, as shown in FIG. 35B, the value of the T-SU is rewritten to 170, which is the number of total sound units T-SU:100 of the file CAT.MSA added to the number of total sound units T-SU:70 of the file MAN.MSA. In addition, the value of the T-PRT is rewritten to 5, which is the number of total parts T-PRT:3 of the file CAT.MSA added to the number of total parts T-PRT:2 of the file MAN.MSA.

In addition, when ATRAC3data files (music programs) are combined, the contents keys contained in the attribute files are newly created. Moreover, the MAC that is a forged copyright information check value is changed.

Furthermore, the part information (see FIG. 22) contained in the attribute file block of the combined file MAN.MSA file is changed (copied) to the attribute file block of the file CAT.MSA. In addition, the part key PRTKEY of each part contained in the attribute file block of which the part information has been added is re-encrypted with a new contents key.

As shown in FIG. 9, since an attribute file is added to the header portion of an ATRAC3data file, if two ATRAC3data files are simply combined, the attribute file block of the file CAT.MSA, a plurality of ATRAC3data blocks of the file CAT.MSA, the attribute file block of the file MAN.MSA, and a plurality of ATRAC3data blocks of the file MAN.MSA are successively combined. Thus, one combination file has two attribute files.

To address this problem, according to the present invention, when the combine process as shown in FIG. 35B is performed, the attribute file of the backward-side data file (in the illustrative embodiment, the file MAN.MSA) is incorporated into the attribute file of the forward-side data file (CAT.MSA) and deleted.

Thus, the attribute file block of the file CAT.MSA, the plurality of ATRAC3data blocks of the file CAT.MSA, and the plurality of ATRAC3data block of the file MAN.MSA are successively arranged.

Editing Reproduction Management File

In addition, with respect to the reproduction management file PBLIST shown in FIG. 11, since data files are combined, the number of total track numbers decreases by one. Thus, the T-TRKs are edited so that they are moved in the direction of TRK-001 without space.

Steps of Combine Process

Figure 36:
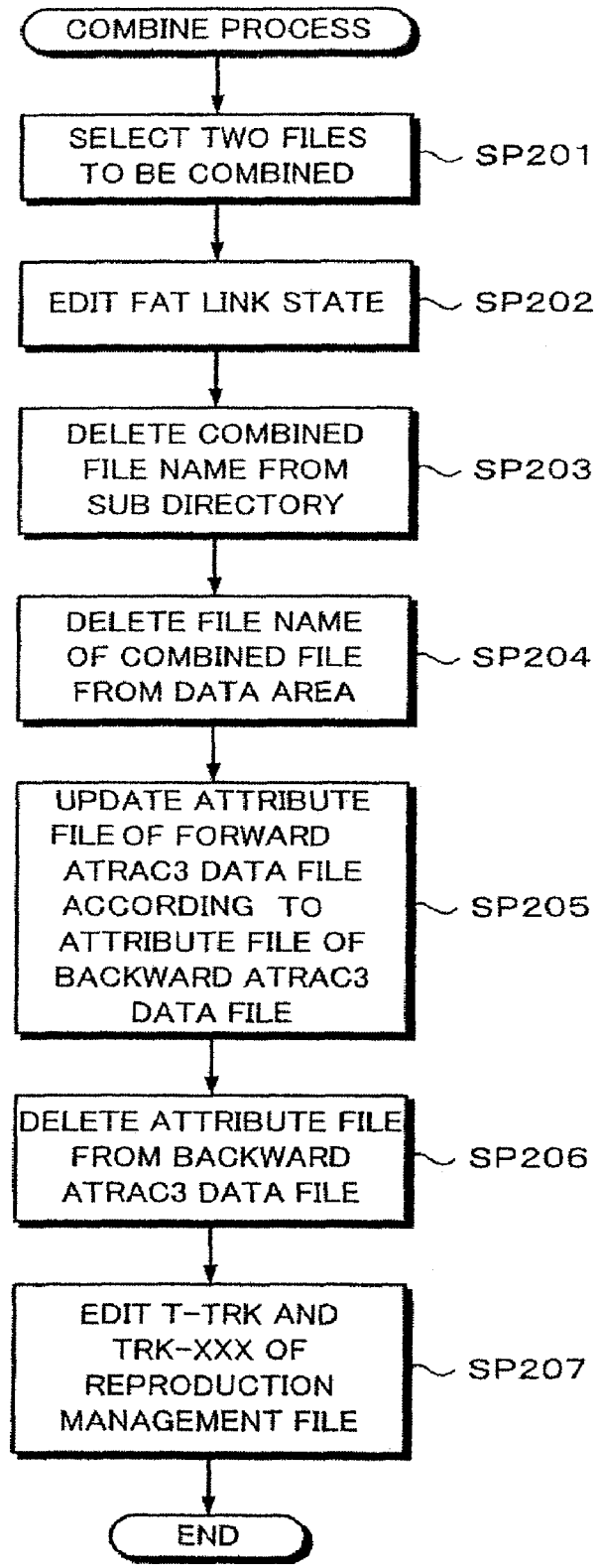
FIG. 36 is a flow chart for explaining the combine process according to an embodiment of the present invention.

FIG. 36 is a flow chart showing the file combine process. At step SP201, the user selects two files to be combined in a predetermined manner. In the illustrative embodiment, the user selects the files CAT.MSA and MAN.MSA. At step SP202, the link state on the FAT is edited. At step SP203, the file name that is linked in the backward direction is deleted from the sub directory. At step SP204, the file name of the data file that is combined in the backward direction is deleted from the data area. At step SP205, the attribute file of the forward-side ATRAC3data file is updated according to the attribute file of the backward-side ATRAC3. As described above, the number of total parts is edited. In addition, the number of total sound units T-SU is edited.

At step SP206, the attribute file of the backward-side ATRAC3 data file is deleted. At step SP207, the T-TRK and the TRK-XXX of the reproduction management file are edited.

Thus, the combine process is performed in the order of (1) editing the FAT, (2) editing the attribute file, and (3) editing the reproduction management file. However, the order may be changed.

Divide Process

Next, a divide process for dividing one file at a particular position will be described.

Divide Process on FAT

Figure 37:
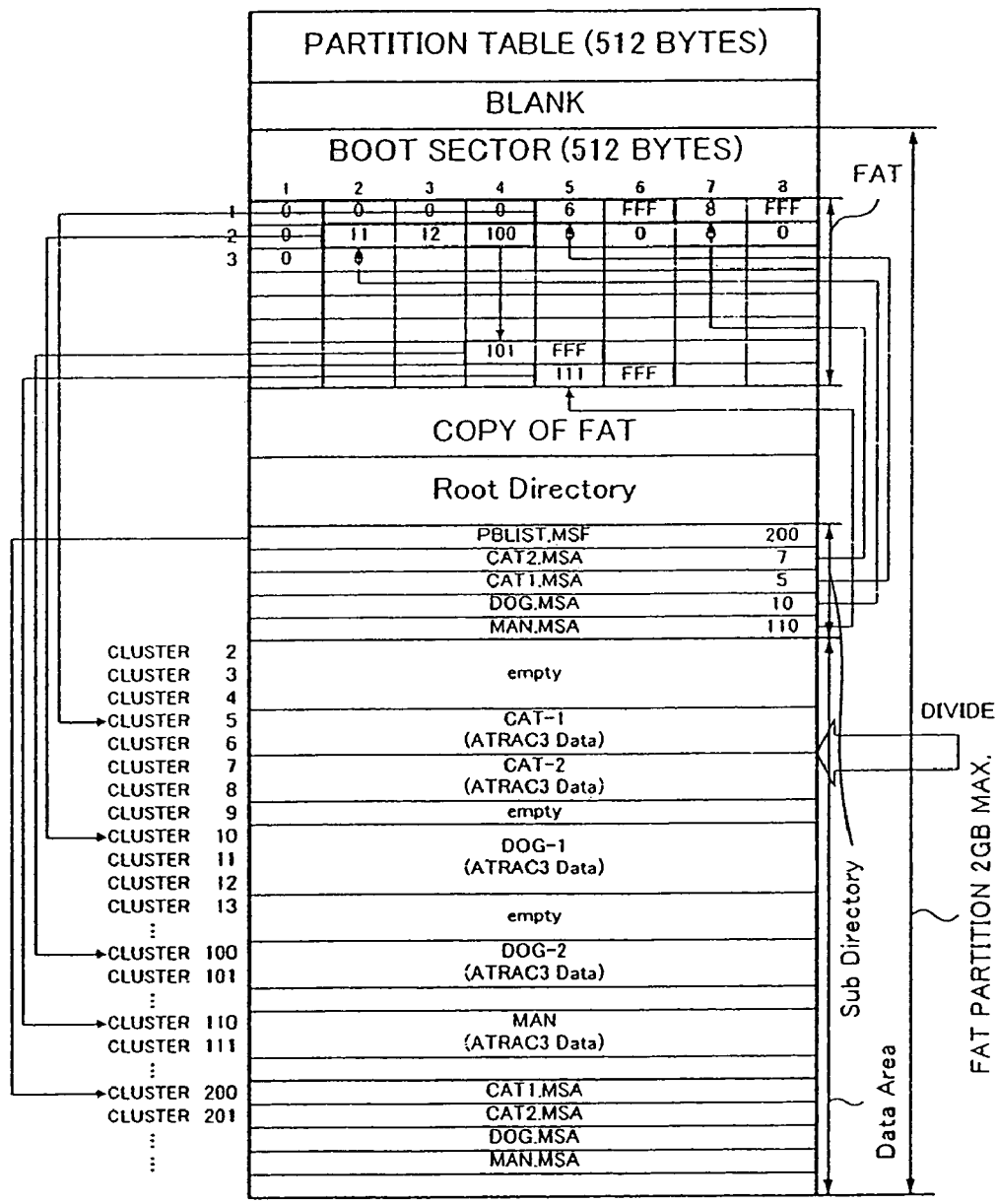
FIG. 37 depicts a memory map for explaining data transitions in a divide process for dividing a particular program in the memory map structure (see FIG. 6) according to an embodiment of the present invention.

FIG. 37 is a diagram showing a memory map for explaining a divide process on the file CAT.MSA from the files shown in FIG. 6.

It is assumed that the user performs the divide operation at the boundary of clusters 6 and 7 of the file CAT.MSA and that the divide process causes two files CAT1.MSA and CAT2.MSA to be generated.

First of all, the files DOG.MSA and MAN.MSA recorded at clusters 201 and 202 are moved to clusters 202 and 203, respectively. In addition, the file CAT1.MSA, which is an extension MSA added to the file name CAT1 inputted by the user, is recorded to cluster 200. In addition, the file name CAT2.MSA, which is an extension MSA added to the file name CAT2inputted by the user, is recorded to cluster 201.

Next, the file name CAT.MSA that is recorded in the sub directory is rewritten to the file name CAT1.MSA. In addition, the file name CAT2.MSA is added to an unused slot.

At the end of the slot of the file CAT2.MSA, the cluster number "7" of the divided file CAT2.MSA is recorded.

The entry address is rewritten to "FFF" so that the end point of the slot of the file name CAT1.MSA of the sub directory on the FAT becomes cluster 6. The divide process is performed on the FAT in the above-described manner.

Editing Attribute Header

When a data file is divided, an attribute file should be generated so that it is added to the divided file on the backward-side data file (i.e., CAT2.MSA).

Next, with reference to FIGS. 38A and 38B, this process will be described.

Figure 38B:
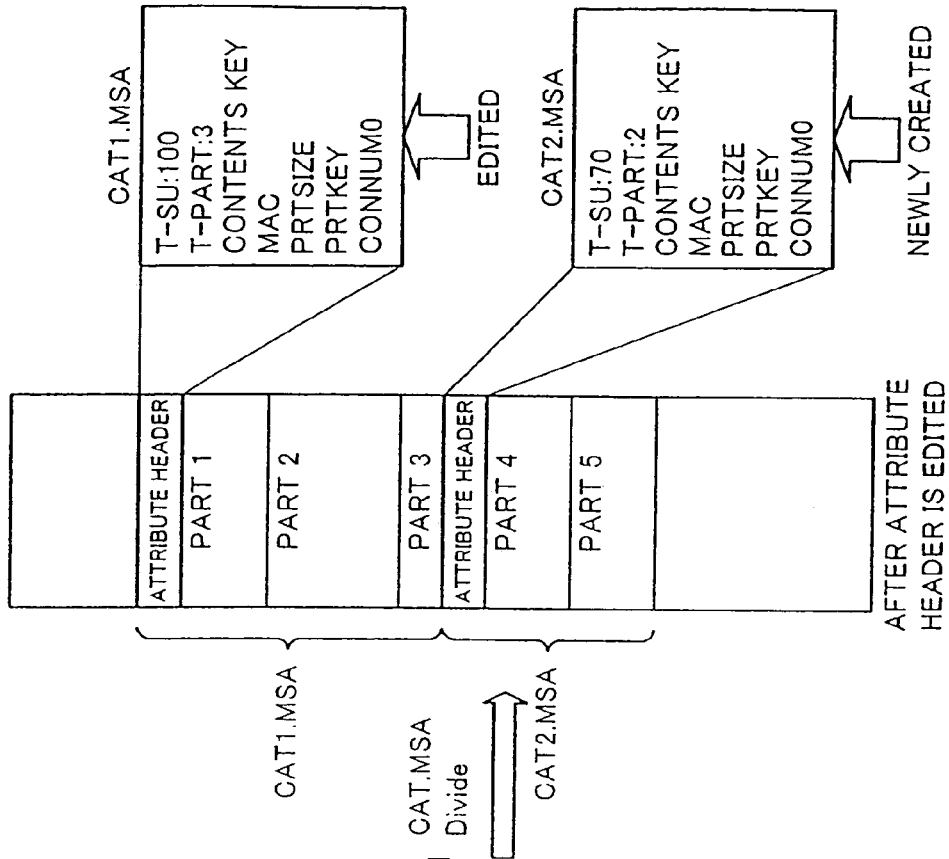
FIG. 38B depicts a memory map after a particular program is divided in accordance with the present invention.
Figure 38A:
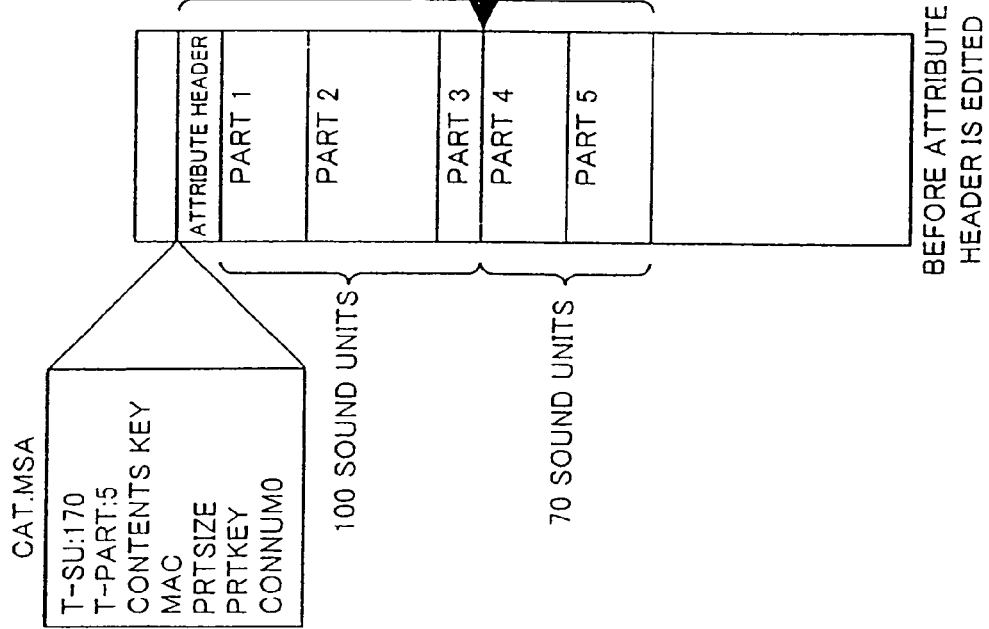
FIG. 38A depicts a memory map before a particular program is divided in accordance with the present invention.

FIGS. 38A and 38B show memory maps where logical addresses have been converted into physical addresses. In FIGS. 38A and 38B, for simplicity, individual parts are successively arranged in memory 42, not dispersed. As shown in FIG. 38A, the attribute file of the file CAT.MSA contains the number of total sound units T-SU:170, the number of total parts T-PRT:5, a contents key, a MAC, a part size and a part key for each part, and a content cumulation number CON-NUM0.

Now, it is assumed that the user designates a divide process at a particular point of the file CAT.MSA. For example, it is assumed that the user performs a divide operation at the boundary between the parts 3 and 4 shown in FIG. 38A. The data of the attribute file is updated in the following manner.

As real update data, when a music program is divided, the number of parts that compose a single file decreases. Thus, the T-PART contained in the attribute file is edited. In addition, when the file is divided, since the number of total sound units in the single file also decreases, the T-SU is also edited. In other words, as shown in FIG. 38B, the number of total sound units of the file CAT1.MSA that is divided on the forward side is rewritten to T-SU:100. In addition, the number of total parts of the file CAT1.MSA is rewritten to T-PART:3.

In addition, since the file is divided, the contents key, the forged copyright information check value MAC, and the part key for each part are rewritten.

In addition, an attribute file of the file CAT2.MSA that is divided on the backward side is newly created.

With respect to the attribute file that is newly created, the number of total sound units and the number of total parts are rewritten to T-SU:70 and T-PART:2, respectively.

In addition, since the file is divided, the contents key, the forged copyright information check value MAC, and the part key for each part are rewritten.

Editing Reproduction Management File

Next, an editing method for the reproduction management file PBLIST in a divide process will be described. When a file is divided into two files, since the number of files increases by one, the number of total tracks T-TRK is increased by 1. In addition, the TRK-X table (where X is any integer in the range from 1 to 400) is edited so that the resultant music program numbers are shifted.

Steps of Divide Process

Figure 39:
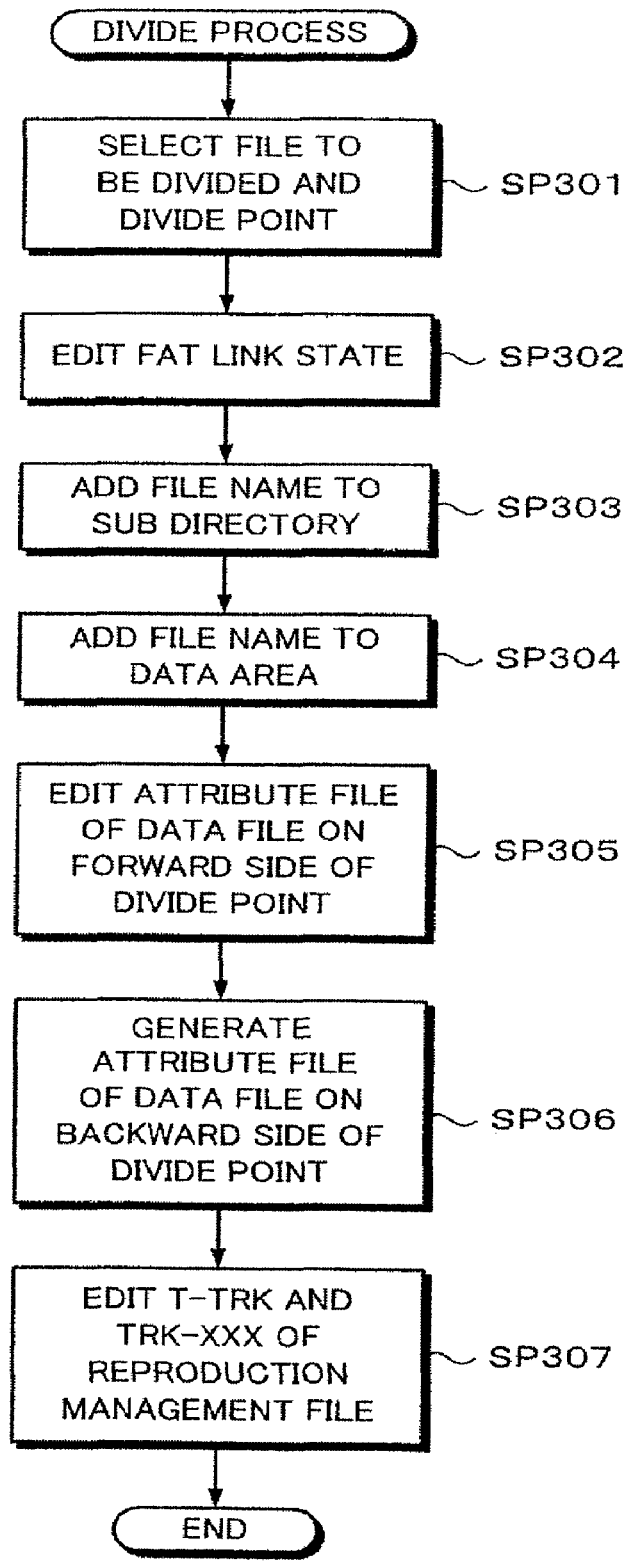
FIG. 39 is a flow chart for explaining the divide process according to an embodiment of the present invention.

FIG. 39 is a flow chart showing a divide process.

At step SP301, when the user selects a file to be divided, while listening to music of the file, he or she selects a divide point in a predetermined manner. At step SP302, the link state of the FAT is edited in the above-described manner. At step SP303, the file name of the data file that is divided on the backward side is added to the sub directory. At step SP304, the file name of the data file that is divided on the forward side is added to the data area. The file names are inputted by the user. At step SP305, the attribute file of the data file on the forward side of the divide point is edited. In addition, at step SP306, the attribute file to be added to the backward-side data file is generated. The attribute file is newly created and the attribute file is edited corresponding to the divide point of the divided file. At step SP307, the reproduction management file PBLIST is edited. The above-described divide process is performed in the order of (1) editing the FAT, (2) editing the attribute file, and (3) editing the reproduction management file. However, the order may be changed.

The present invention enables a user to edit data files (ATRAC3files) recorded in memory card 40. Next, edit processes (for example, combine process and divide process) corresponding to the track management file TRKLIST described with reference to FIGS. 25 to 32 will be described in detail. However, the following description can be applied to the track information area TRKINF and the part information area PRTINF of an ATRAC3data file.

Figure 40:
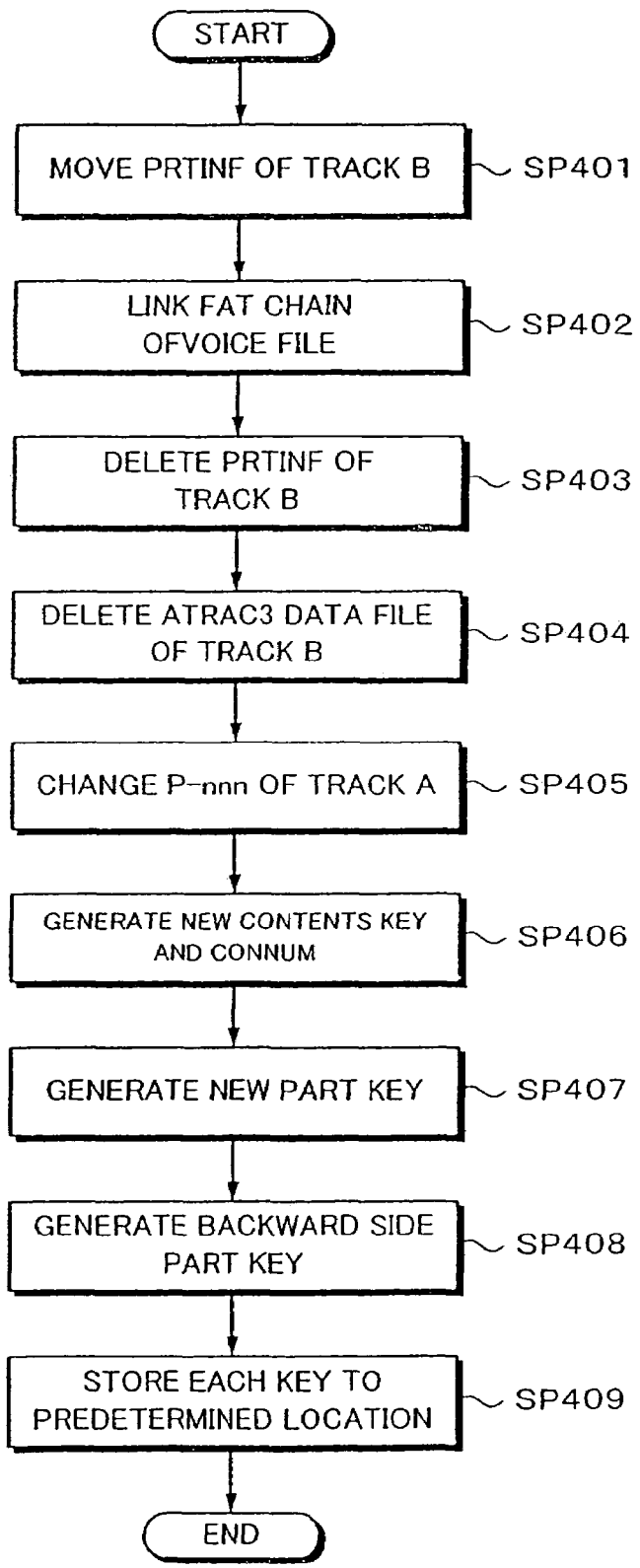
FIG. 40 is a flow chart for explaining the combine process according to an embodiment of the present invention.

In this section, with reference to FIG. 40, a combine process (see FIG. 10B) for combining two tracks A and B composed of one part each will be described. FIG. 40 is a flow chart showing the combine process. At step 401, the part information area PRTINF of track B on the backward side is moved below the part information area PRTINF of track A. Thus, in the track information management file TRKLIST, the track information area TRKINF of track A, the part information area PRTINF of track A, the part information area PRTINF of track B, and the track information area TRKINF of track B are successively arranged.

At step 402, the chain of the FAT of the ATRAC3data file of track B is linked on the backward side of the chain of the FAT of the ATRAC3data file of track A. At step 403, the track information area TRKINF of track B is deleted from the track information management file TRKLIST. Thus, in the track information management file TRKLIST, the track information area TRKINF of track A, the part information area PRTINF of the track A, and the part information area PRTINF of track B are successively arranged. At step 404, the ATRAC3data file of track B is deleted from the directory. At step 405, P-nnn representing the number of parts that compose a music program in the track information area TRKINF of track A is changed from 1 to 1+1=2.

Thus, the values of the keys are changed. In this example, the contents key of the original track A is denoted by KC_A; and the contents key of the original track B is denoted by KC_B. Likewise, the part key of the original track A is denoted by KP_A; and the part key of the original track B is denoted by KP_B.

At step 406, after tracks A and B are combined, the contents key of the new track N is generated as KC_N. The CONNUM is also newly generated. At step 407, a new part key is generated. The new part key is generated with an exclusive OR operation of the contents key KC_A, the part key KP_A, and the contents key KC_N. At step 408, the backward-side part key (namely, the part key for the part information area PRTINF of the original track B) is generated. Similar to the new part key, the backward-side part key is generated with an exclusive OR operation of the contents key KC_B, the part key KP_B, and the contents key KC_N.

At step 409, the contents key KC_N of the new track N is encrypted with the storage key of memory card 40 and stored in the CONTENTS KEY-nnn of the track information area TRKINF. The CONNUM is stored in the CONNUM-nnn of the track information area TRKINF. In addition, each part key is stored in the PRTKEY-nnn of the part information area PRTINF.

Figure 41:
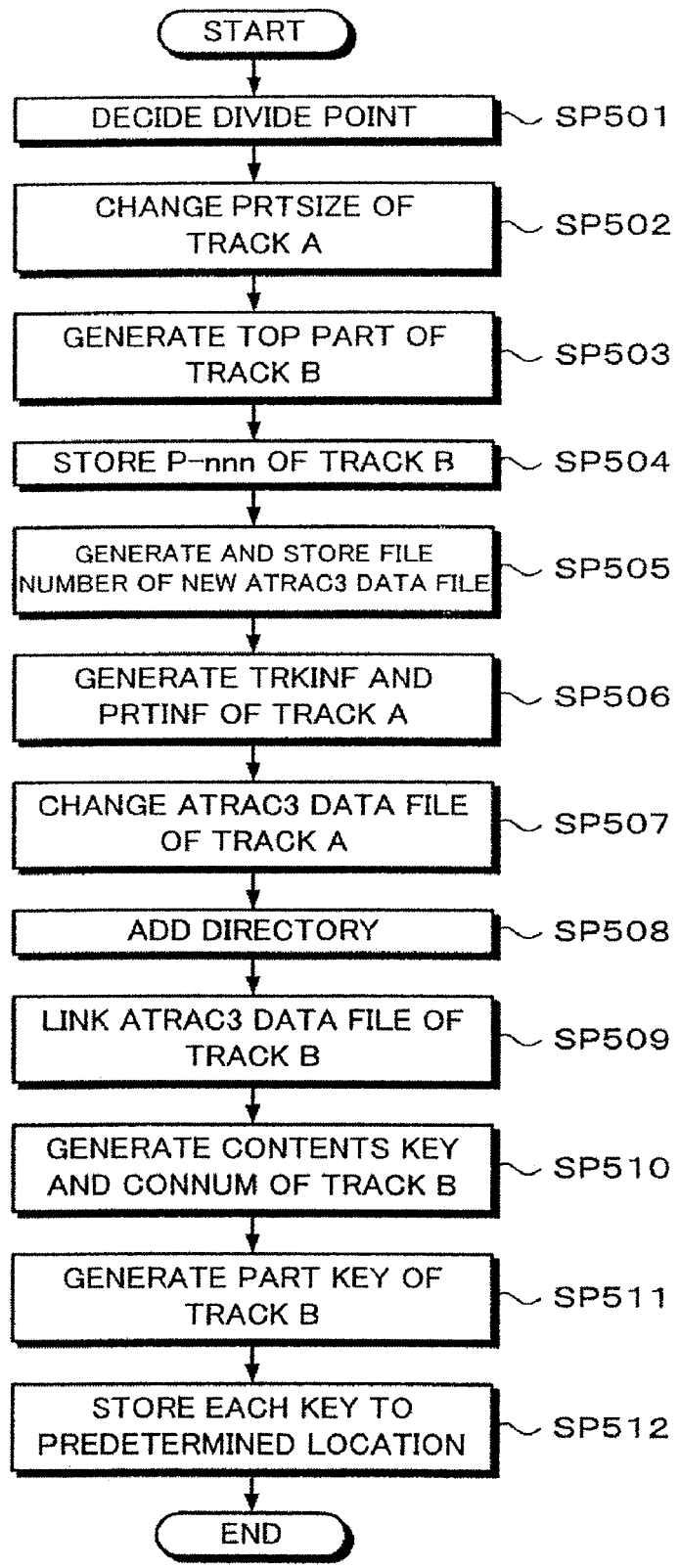
FIG. 41 is a flow chart for explaining the divide process according to an embodiment of the present invention.
Figures 42A, 42B, 42C, 42D, 42E:
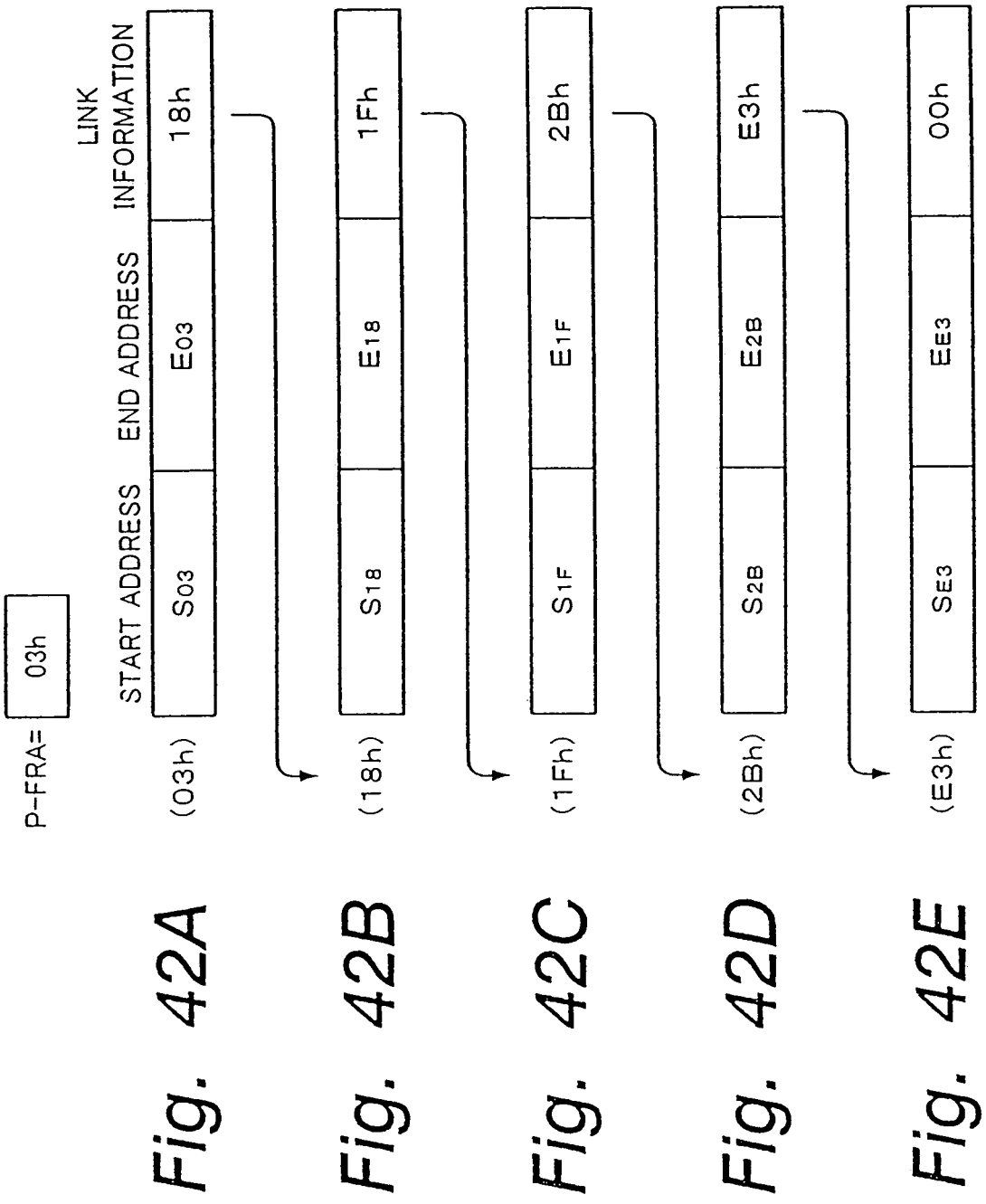
FIG. 42A depicts a management method for one part of a U-TOC (User-Table of Contents) for managing recordable areas dispersed on a magneto-optical disc.
FIG. 42B depicts a management method for a part combined corresponding to a part shown in FIG. 42A.
FIG. 42C depicts a management method for a part combined corresponding to a part shown in FIG. 42B.
FIG. 42D depicts a management method for a part combined corresponding to a part shown in FIG. 42C.
FIG. 42E depicts a management method for a part combined corresponding to a part shown in FIG. 42D.

Next, with reference to FIG. 41, the divide process (see FIG. 10C) for dividing a track A composed of one part into two tracks A and B will be described. FIG. 41 is a flow chart showing the divide process. At step 501, the divide point is decided at an SU. At step 502, the PRTSIZE of the part information area PRTINF of the new track A is changed. In reality, the number of clusters from the beginning (start SU) to the divide point (end SU) is counted. The cluster size, the start SU, and the end SU are changed corresponding to the position of the divide point of the cluster and stored to the PRTSIZE of the part information area of the new track A.

At step 503, one cluster that is the last cluster of the new track A that contains the divide point is completely copied. The copied cluster is treated as the top part of the new track B. At step 504, the number of total parts of the newly generated track B is stored to the P-nnn representing the number of parts that compose a music program in the track information area TRKINF of track B. In this example, clusters preceded by the divide point become the second part, which is the newly generated track B. The number of total parts of the newly generated track B is counted. At step 505, the file number FNW-nnn of the new ATRAC3data file is generated and stored to the FNW-nnn of the track information area TRKINF.

At step 506, the track information area TRKINF of the new track B and the part information area PRTINF are added on the backward side of the part information area PRTINF of the new track A of the track information management file TRKLIST. The track information area TRKINF of the track on the backward side of the original track A and the part information area PRTINF are moved backward by the track information area TRKINF and the part information area PRTINF of track B.

At step 507, the chain of the FAT of the ATRAC3data file of the new track A is changed to the divide point. At step 508, since track B is newly added, file B of the ATRAC3data file is added to the directory. At step 509, the chain of the FAT of the ATRAC3data file of the newly generated track B is followed by the remaining portion of the original track A (namely, the chain of the clusters including the divide point).

Since the new track B is added, the key values are added. However, the key values of the new track A are not changed.

At step 510, after the track is divided, the contents key KC_B of the new track B is generated. In addition, the CONNUM is newly generated. At step 511, the part key KP_B of the new track B is generated. The part key of the new track B is generated with an exclusive OR operation of the original KC_A, KP_A, and KC_B.

At step 512, the contents key KC_B of the new track B is encrypted with the storage key of memory card 40 and stored to the CONTENTS KEY-nnn of the track information area TRKINF. In addition, the CONNUM is stored to the CONNUM-nnn of the track information area TRKINF. Each part-key is directly stored to the PRTKEY-nnn of the part information area PRTINF.

Thus, even if edit processes such as combine and divide processes are performed, the track information area TRKFNF and the part information area PRTINF are arranged in the same order of ATRAC3data files. In other words, unlike the Link-P system, the track information area TRKINF of one file that has been edited and the link destination of the part information area PRTINF are arranged successively, not randomly.

In addition, when another edit process such as an erase process or a move process is performed, the track information area TRKINF and the part information area PRTINF are re-arranged in the same order as ATRAC3data files.

According to the present invention, even if the FAT of flash memory 42 is destroyed, an attribute file is added at the beginning of each file so as to manage parts that may be dispersed in the memory using the attribute file. Thus, the editing process is properly performed. In addition, the editing process can be properly performed for a recording medium such as a flash memory in which block defects tend to take place.

It will thus be seen that the objects set forth above, among those made apparent from the preceding description, are efficiently attained and, because certain changes may be made in carrying out the above method(s) and in the construction(s) set forth without departing from the spirit and scope of the invention, it is intended that all matter contained in the above description and shown in the accompanying drawings shall be interpreted as illustrative and not in a limiting sense.

What is claimed is:

1. An editing apparatus for editing a data file recorded in a nonvolatile memory for segmenting a single data file that is successively reproduced to blocks each having a predetermined data length, the nonvolatile memory having a data area for recording each block along with an attribute file having a predetermined length and a management area for recording management data for managing a data file recorded in the data area, the editing apparatus comprising:

operating means for selecting two data files recorded in the data area so as to perform a combine process for the selected two data files;

separating means for separating an attribute file from a backward side data file of the selected two data files;

editing means for editing the management data recorded in the management area so that the two data files are logically linked and editing an attribute file added to a forward side data file of the selected two data files;

recording means for recording the management data edited by said editing means to the management area and recording the attribute file added to the forward side data file to the data area; and wherein the operating means selectively supplies a reproduction output signal to an analog-to-digital converter.

\* \* \* \* \*